(12) United States Patent
Takahashi et al.

(10) Patent No.: US 8,508,460 B2
(45) Date of Patent: Aug. 13, 2013

(54) SCANNING SIGNAL LINE DRIVE CIRCUIT AND DISPLAY DEVICE INCLUDING THE SAME

(75) Inventors: Yoshihisa Takahashi, Osaka (JP); Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/512,892

(22) PCT Filed: Oct. 14, 2010

(86) PCT No.: PCT/JP2010/068017
§ 371 (c)(1),
(2), (4) Date: May 31, 2012

(87) PCT Pub. No.: WO2011/074316
PCT Pub. Date: Jun. 23, 2011

(65) Prior Publication Data
US 2012/0249502 A1 Oct. 4, 2012

(30) Foreign Application Priority Data

Dec. 15, 2009 (JP) ................. 2009-283610

(51) Int. Cl.
*G09G 3/36* (2006.01)

(52) U.S. Cl.
USPC ............... 345/100; 345/87; 345/98; 345/204

(58) Field of Classification Search
USPC ................. 345/99, 100, 204, 205, 84, 87, 98
See application file for complete search history.

(56) References Cited

U.S. PATENT DOCUMENTS

| 6,690,347 | B2 * | 2/2004 | Jeon et al. ............... 345/100 |
| 8,314,765 | B2 * | 11/2012 | Umezaki ................. 345/98 |
| 8,384,648 | B2 * | 2/2013 | Cho et al. ............... 345/100 |
| 2003/0002615 | A1 | 1/2003 | Morosawa et al. |
| 2003/0128180 | A1 * | 7/2003 | Kim et al. ............... 345/100 |

(Continued)

FOREIGN PATENT DOCUMENTS

| JP | 2001-052494 A | 2/2001 |
| JP | 2003-016794 A | 1/2003 |

(Continued)

OTHER PUBLICATIONS

Official Communication issued in International Patent Application No. PCT/JP2010/068017, mailed on Jan. 25, 2011.

*Primary Examiner* — Amare Mengistu
*Assistant Examiner* — Koosha Sharifi-Tafreshi
(74) *Attorney, Agent, or Firm* — Keating & Bennett, LLP

(57) ABSTRACT

It is an object to realize a gate driver that can cause a scanning signal to quickly fall after a charge period in each row ends. A gate driver is configured by two shift registers. In an n-th stage bistable circuit (SR(n)) in an entire shift register (410), a region netA connected to a gate terminal of a thin-film transistor that increases a potential of an output node for outputting a state signal (Q) based on a first clock (CKA) is set to an on level based on the state signal (Q) outputted from an (n−2)-th stage bistable circuit (SR(n−2), the region netA is set to an off level based on the state signal (Q) outputted from an (n+2)-th stage bistable circuit (SR(n+2)), and the output node is set to an off level based on the state signal (Q) outputted from an (n+3)-th stage bistable circuit (SR(n+3)).

20 Claims, 19 Drawing Sheets

(56) References Cited

U.S. PATENT DOCUMENTS

| | | |
|---|---|---|
| 2004/0150610 A1* | 8/2004 | Zebedee et al. ............... 345/100 |
| 2006/0071890 A1 | 4/2006 | Kikuchi |
| 2006/0071923 A1 | 4/2006 | Lee et al. |
| 2006/0227093 A1* | 10/2006 | Jang et al. .................... 345/100 |
| 2007/0229441 A1* | 10/2007 | Liu et al. ....................... 345/100 |
| 2007/0247932 A1 | 10/2007 | Tobita |
| 2010/0164915 A1* | 7/2010 | Kim et al. ..................... 345/205 |
| 2010/0295838 A1 | 11/2010 | Umezaki et al. |
| 2010/0321372 A1 | 12/2010 | Iwamoto et al. |
| 2011/0018845 A1 | 1/2011 | Mizunaga et al. |

FOREIGN PATENT DOCUMENTS

| | | |
|---|---|---|
| JP | 2005-094335 A | 4/2005 |
| JP | 2006-106394 A | 4/2006 |
| JP | 2006-107692 A | 4/2006 |
| JP | 2006-127630 A | 5/2006 |
| JP | 2007-317344 A | 12/2007 |
| JP | 2009-134814 A | 6/2009 |
| JP | 2011-004393 A | 1/2011 |
| WO | 2009/104306 A1 | 8/2009 |
| WO | 2009/116214 A1 | 9/2009 |

* cited by examiner

Fig.17

| | FIRST SHIFT REGISTER | SECOND SHIFT REGISTER | THIRD SHIFT REGISTER |
|---|---|---|---|
| ODD-ORDER STAGE | GCK1 → CKA | GCK2 → CKA | GCK3 → CKA |
| | GCK4 → CKB | GCK5 → CKB | GCK6 → CKB |
| | GCK5 → CKC | GCK6 → CKC | GCK1 → CKC |
| | GCK2 → CKD | GCK3 → CKD | GCK4 → CKD |
| EVEN-ORDER STAGE | GCK4 → CKA | GCK5 → CKA | GCK6 → CKA |
| | GCK1 → CKB | GCK2 → CKB | GCK3 → CKB |
| | GCK2 → CKC | GCK3 → CKC | GCK4 → CKC |
| | GCK5 → CKD | GCK6 → CKD | GCK1 → CKD |

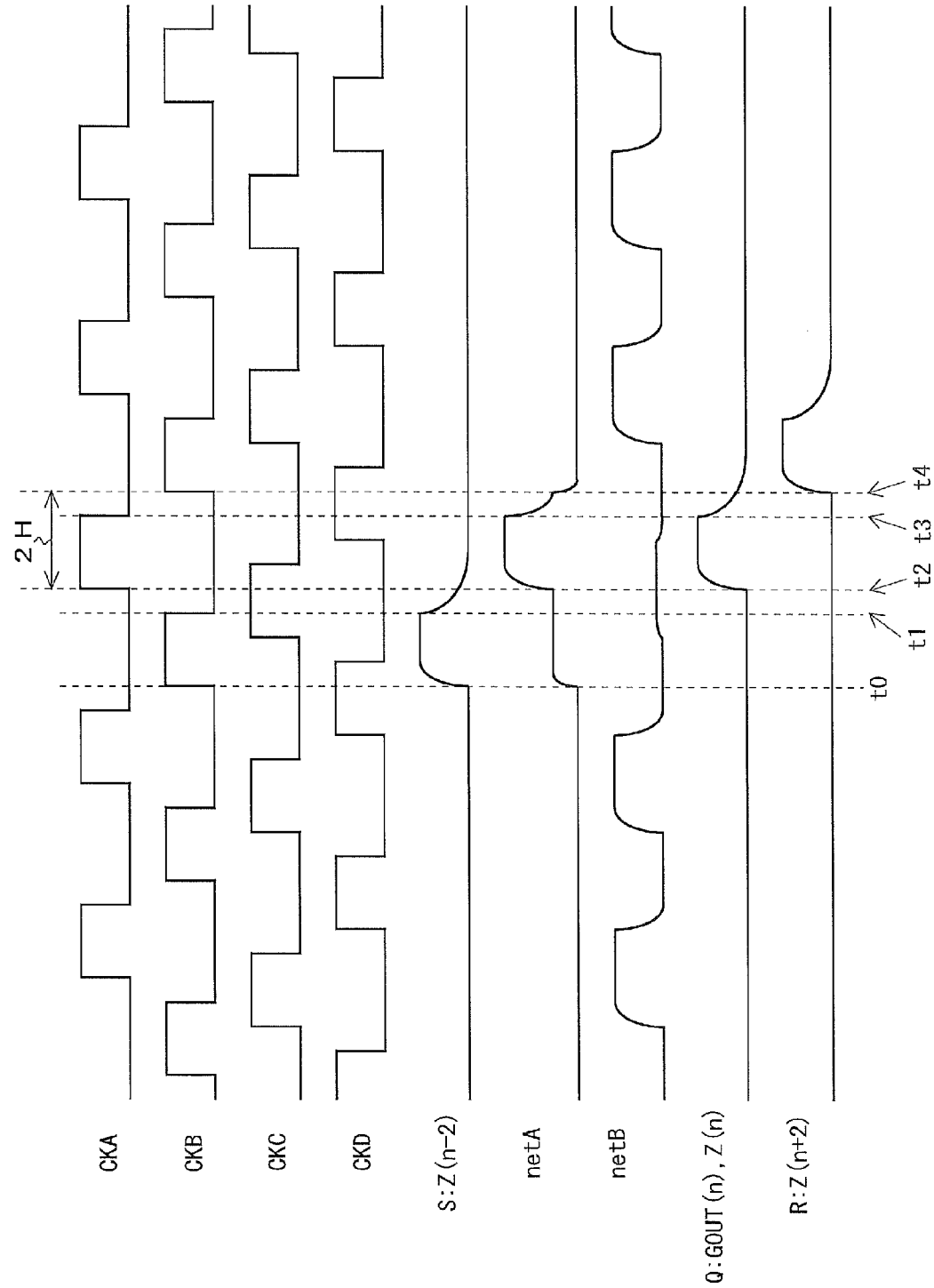

SCANNING SIGNAL LINE DRIVE CIRCUIT AND DISPLAY DEVICE INCLUDING THE SAME

TECHNICAL FIELD

The present invention relates to a display device and a drive circuit for the display device, and relates, more particularly, to a scanning signal line drive circuit that includes a plurality of shift registers for driving scanning signal lines which are arranged in a display unit of the display device.

BACKGROUND ART

In recent years, there is being progressed development of a monolithic structure of a gate driver (a scanning signal line drive circuit) that drives a gate bus line (a scanning signal line), in a liquid crystal display device. Conventionally, a gate driver is often mounted on a peripheral part of a substrate that constitutes a liquid crystal panel, as an IC (Integrated Circuit) chip. However, in recent years, direct formation of a gate driver on a substrate is gradually increased. Such a gate driver is called a "monolithic gate driver", for example. In a liquid crystal display device that includes a monolithic gate driver, a thin-film transistor that uses amorphous silicon (a-Si) (hereinafter, referred to as an "a-SiTFT") is conventionally employed as a drive element. However, in recent years, a thin-film transistor that uses microcrystalline silicon ($\mu$c-Si) (hereinafter, referred to as a "$\mu$c-SiTFT") is being tentatively employed. Mobility of microcrystalline silicon is larger than mobility of amorphous silicon, and further, a $\mu$c-SiTFT is formed by a process similar to that of an a-SiTFT. Therefore, based on employment of the $\mu$c-SiTFT for a drive element, it is expected to achieve cost reduction through reduction of a picture-frame area and reduction of the number of chips of a driver IC, improvement of packaging yield, an increase in a size of a display device, and the like.

A display unit of an active matrix-type liquid crystal display device includes a plurality of source bus lines (video signal lines), a plurality of gate bus lines, and a plurality of pixel formation portions that are provided at respective intersections of the plurality of source bus lines and the plurality of gate bus lines. The pixel formation portions constitute a pixel array by being arranged in a matrix shape. Each pixel formation portion includes a thin-film transistor which is a switching element having a gate terminal connected to a gate bus line passing through a corresponding intersection and having a source terminal connected to a source bus line passing through the intersection, and includes a pixel capacitance for holding a pixel voltage value. Further, the active matrix-type liquid crystal display device is provided with the gate driver, and a source driver (a video signal line drive circuit) for driving the source bus line.

A video signal that indicates a pixel voltage value is transmitted by source bus lines, but each source bus line cannot temporarily (simultaneously) transmit a video signal that indicates pixel voltage values of a plurality of rows. Therefore, writing (charge) of video signals into pixel capacitances in the pixel formation portions that are arranged in a matrix shape is sequentially performed row by row. Hence, a gate driver is configured by a shift register that includes a plurality of stages, such that a plurality of gate bus lines are sequentially selected during each predetermined period. Each stage of the shift register is a bistable circuit that is in either one of two states (a first state and a second state) at each time point and that outputs a signal indicating this state (hereinafter, referred to as a "state signal") as a scanning signal. Active scanning signals are sequentially outputted from a plurality of bistable circuits in the shift register, thereby writing of video signals into the pixel capacitances is sequentially performed row by row, as described above.

Relating to the present invention, the following prior arts are known. Japanese Patent Application Laid-Open Publication No. 2005-94335 discloses a configuration for suppressing a variation of a threshold characteristic of a transistor, concerning a shift register that is provided in an electronic device such as an image reading device. Japanese Patent Application Laid-Open Publication No. 2003-16794 discloses a configuration for preventing a malfunction of a transistor attributable to a parasitic capacitance of the transistor, concerning a shift register that is provided in an electronic device. Japanese Patent Application Laid-Open Publication No. 2006-106394 discloses a configuration for operating two gate drivers by using a multiphase clock, concerning a liquid crystal display device. Japanese Patent Application Laid-Open Publication No. 2006-107692 discloses a configuration for preventing a malfunction attributable to a variation of a threshold voltage of a transistor, concerning a shift register that is provided in a display panel. Japanese Patent Application Laid-Open Publication No. 2006-127630 discloses a configuration for operating a shift register by using a plurality of clocks, concerning a shift register that is used in a liquid crystal display device. Japanese Patent Application Laid-Open Publication No. 2001-52494 discloses a configuration for preventing attenuation of a level of an output signal and a variation of a threshold voltage characteristic of a transistor, concerning a shift register that is provided in an electronic device.

PRIOR ART DOCUMENTS

Patent Documents

[Patent Document 1] Japanese Patent Application Laid-Open Publication No. 2005-94335
[Patent Document 2] Japanese Patent Application Laid-Open Publication No. 2003-16794
[Patent Document 3] Japanese Patent Application Laid-Open Publication No. 2006-106394
[Patent Document 4] Japanese Patent Application Laid-Open Publication No. 2006-107692
[Patent Document 5] Japanese Patent Application Laid-Open Publication No. 2006-127630
[Patent Document 6] Japanese Patent Application Laid-Open Publication No. 2001-52494

SUMMARY OF THE INVENTION

Problems to be Solved by the Invention

By the way, in recent years, in a liquid crystal display device that includes a monolithic gate driver, a larger size and higher definition of a panel are being progressed. When a panel becomes large sized, a load capacitance of the gate bus line increases accordingly. As a result, a time required for a scanning signal (a state signal) to fall becomes long. Consequently, there is a possibility that a scanning signal in a certain row does not fall to a low level (a level at which a thin-film transistor in a pixel formation portion becomes in an off state) until a charge period for a pixel capacitance of a next row starts after a charge period for a pixel capacitance of this row ends. As a result, a display failure occurs due to a color mixture between a color to be displayed in a certain row and a color to be displayed in the next row. Further, a charge time per one line becomes short by higher definition of a panel, and therefore, a display failure attributable to a color mixture as described above occurs. The occurrence of a display failure attributable to this color mixture is described based on a configuration of a bistable circuit that is included in a shift register and a waveform of input/output signals of the bistable circuit. The following description is based on an assumption that all thin-film transistors that are provided in the bistable circuit are n-channel type transistors.

FIG. 19 is a circuit diagram showing a configuration example of a bistable circuit that is included in a shift register of a gate driver. As shown in FIG. 19, the bistable circuit includes 12 thin-film transistors T1 to T12, and a capacitor CAP. Further, the bistable circuit has seven input terminals 41 to 47, and two output terminals 51, 52 for outputting state signals Q, in addition to an input terminal for a low-level power source voltage VSS. The state signal Q that is outputted from the output terminal 51 is provided to a gate bus line corresponding to this bistable circuit, as a scanning signal GOUT. The state signal Q that is outputted from the output terminal 52 is provided to a bistable circuit of a stage different from a stage of this bistable circuit, as a signal Z for controlling an operation of the bistable circuit of the different stage (hereinafter, referred to as an "other-stage control signal").

A gate terminal of the thin-film transistor T1, a source terminal of the thin-film transistor T2, a drain terminal of the thin-film transistor T3, a drain terminal of the thin-film transistor T4, a drain terminal of the thin-film transistor T5, a gate terminal of the thin-film transistor T7, and a gate terminal of the thin-film transistor T11 are connected to each other. A region (a wiring) in which these terminals are connected to each other is called a "netA" for the sake of convenience. A gate terminal of the thin-film transistor T5, a source terminal of the thin-film transistor T6, a drain terminal of the thin-film transistor T7, and a drain terminal of the thin-film transistor T8 are connected to each other. A region (a wiring) in which these terminals are connected to each other is called a "netB" for the sake of convenience.

The gate driver described here is assumed to include two shift registers. A scanning signal GOUT that is outputted from a bistable circuit in one shift register is provided to a gate bus line of an odd-order row, and the scanning signal GOUT that is outputted from a bistable circuit in the other shift register is provided to a gate bus line of an even-order row. That is, it can be considered that "the two shift registers realize one shift register that sequentially selects each one of a plurality of gate bus lines in a display unit". In the following description, therefore, a configuration in which a plurality of (two, in this example) shift registers that are provided to sequentially select each one of the plurality of gate bus lines are combined is called an "entire shift register".

In the above configuration, an n-th stage bistable circuit of the entire shift register operates as follows (see FIG. 20). A first clock CKA, a second clock CKB, a third clock CKC, and a fourth clock CKD are provided to the input terminals 43, 47, 45, and 46, respectively. Another-stage control signal Z(n−2) that is outputted from an (n−2)-th stage bistable circuit is provided to the input terminal 41, as a set signal S. An other-stage control signal Z(n+2) that is outputted from an (n+2)-th stage bistable circuit is provided to the input terminal 44, as a reset signal R. A period from a time point t1 to a time point t2 and a period from a time point t3 to a time point t4 are not provided in general or are set as very short periods. In FIG. 20, the period from the time point t1 to the time point t2 and the period from the time point t3 to the time point t4 are shown as periods longer than original periods. For the sake of convenience, the time point t1 and the time point t2 are described separately, and the time point t3 and the time point t4 are described separately. This is similarly applied to FIG. 3, FIG. 11, and FIG. 18, and to their descriptions.

When reaching a time point t0, the set signal S changes from a low level to a high level. Accordingly, the thin-film transistor T2 becomes in an on state, the capacitor CAP is charged, and a potential of the netA changes from a low level to a high level. As a result, the thin-film transistors T1, T11 become in an on state. When reaching the time point t1, the set signal S changes from a high level to a low level. Accordingly, the thin-film transistor T2 becomes in an off state. At this time, the potential of the netA is maintained by the capacitor CAP, and is therefore, maintained at a high level.

When reaching the time point t2, the first clock CKA changes from a low level to a high level. At this time, because the thin-film transistors T1, T11 are in the on state, potentials of the state signals Q (potentials of the output terminals 51, 52) increase with an increase in a potential of the input terminal 43. When the potential of the output terminal 51 increases, the potential of the netA also increases via the capacitor CAP. As a result, a large voltage is applied to gate terminals of the thin-film transistors T1, T11, and potentials of the state signals Q increase to a level sufficient for the gate bus line connected to the output terminal 51 of the bistable circuit to become in a selected state.

When reaching the time point t3, the first clock CKA changes from the high level to a low level. At this time, because the thin-film transistors T1, T11 are in the on state, a current flows between the source and the drain of the thin-film transistors T1, T11 based on a decrease in the potential of the input terminal 43, and the potentials of the state signals Q (the potentials of the output terminals 51, 52) gradually decrease. Because the capacitor CAP is provided between the output terminal 51 and the netA as shown in FIG. 19, the potential of the netA also decreases in accordance with a decrease in a potential of the output terminal 51. However, because the potential of the netA decreases by approximately the decrease in the potential of the output terminal 51, the potential of the netA does not decrease to a low level, and is maintained at a high level.

When reaching the time point t4, the reset signal R and the second clock CKB change from a low level to a high level, respectively. Accordingly, the thin-film transistors T4, T9, and T10 becomes in an on state. By the thin-film transistor T4 becoming in the on state, the potential of the netA decreases to a low level. At this time, the potential of the output terminal 51 also decreases by the thin-film transistors T9, T10 becoming in the on state, the potential decrease becomes mild. This is for the following reason. When reaching the time point t4, the potential of the netA becomes at a low level, and the thin-film transistor T1 becomes in an off state. Because, in general, the period from the time point t3 to the time point t4 is not provided or is set to a very short period, an effect of the decrease in the potential of the output terminal 51 based on flow of a current between the source and the drain of the thin-film transistor T1 is not obtained.

As described above, the potential of the output terminal 51 gradually decreases. That is, fall of the scanning signal GOUT after a charge period in each row ends becomes mild. Therefore, with the trend toward a larger size and higher definition of a panel, a risk of occurrence of a display failure attributable to a color mixture as described above increases.

An object of the present invention is to realize a gate driver that can cause a scanning signal to quickly fall after a charge period in each row ends, to prevent occurrence of a display failure attributable to a color mixture.

Means for Solving the Problems

A first aspect of the present invention is directed to a scanning signal line drive circuit of a display device, that drives a plurality of scanning signal lines which are arrayed in a display unit, the circuit comprising:

a plurality of shift registers, each shift register including a plurality of bistable circuits having a first state and a second state and connected in series with each other, and each shift register operating based on a plurality of clock signals that cyclically repeat a first level change of changing from a second level to a first level and a second level change of changing from the first level to the second level, and in each shift register, the plurality of bistable circuits sequentially become in the first state by one of the plurality of clock signals being provided to each bistable circuit as a scanning signal line drive clock signal, wherein a clock signal of which a change timing of a level is different is provided in each shift register as the scanning signal line drive clock signal, each bistable circuit includes an output node that is connected to the scanning signal line and that outputs a state signal which indicates either one of the first state and the second state, an output control switching element having a second electrode to which the scanning signal line drive clock signal is provided, and a third electrode connected to the output node, a first node turn-on unit that changes a level of a first node that is connected to a first electrode of the output control switching element to an on level based on the state signal which is outputted from a bistable circuit of a previous stage of the bistable circuit concerned, and a first node turn-off unit that receives the state signal which is outputted from a bistable circuit of a subsequent stage of the bistable circuit concerned, as a first node turn-off signal, and that changes a level of the first node to an off level based on the first node turn-off signal, and in each bistable circuit, after the bistable circuit concerned becomes in the first state, and after the scanning signal line drive clock signal performs the second level change, a level of the first node turn-off signal changes such that turn-off of the first node is performed, during a period from a time point after a bistable circuit of a next stage of the bistable circuit concerned in a shift register that includes the bistable circuit concerned becomes in the first state till a time point when the scanning signal line drive clock signal performs the first level change.

According to a second aspect of the present invention, in the first aspect of the present invention, each bistable circuit further includes an output node turn-off unit that receives the state signal which is outputted from a bistable circuit of a subsequent stage of the bistable circuit concerned, as an output node turn-off signal, and that turns off the output node based on the output node turn-off signal, and in each bistable circuit, after the bistable circuit concerned becomes in the first state, a level of the first node turn-off signal changes such that turn-off of the first node is performed, during a period from a time point after a time point when a level of the output node turn-off signal changes such that turn-off of the output node is performed till a time point when the scanning signal line drive clock signal performs the first level change.

According to a third aspect of the present invention, in the first aspect of the present invention, each bistable circuit further includes a first node control switching element having a second electrode connected to the first node and a third electrode to which a potential of an off level is applied, and a second node control unit that controls a potential of a second node which is connected to a first electrode of the first node control switching element based on a clock signal other than the scanning signal line drive clock signal out of the plurality of clock signals and a potential of the first node.

According to a fourth aspect of the present invention, in the first aspect of the present invention, the scanning signal line drive circuit comprises two shift registers each identical with the shift register, the two shift registers alternately output the state signal in the first state for each one of the plurality of scanning signal lines, and the state signal that is outputted from a bistable circuit of a third stage after the bistable circuit concerned is provided to each bistable circuit in an entire shift register array which includes the two shift registers, as the first node turn-off signal.

According to a fifth aspect of the present invention, in the fourth aspect of the present invention, timings when output of the state signal in the first state is performed from the two shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to two horizontal scanning periods.

According to a sixth aspect of the present invention, in the fourth aspect of the present invention, the two shift registers operate based on a first clock signal that is provided to a first-stage bistable circuit of one of the shift registers as the scanning signal drive clock signal, a second clock signal having a phase deviated from that of the first clock signal by 180 degrees, a third clock signal having a phase delayed from that of the first clock signal by 90 degrees, and a fourth clock signal having a phase deviated from that of the third clock signal by 180 degrees.

According to a seventh aspect of the present invention, in the first aspect of the present invention, the scanning signal line drive circuit comprises m shift registers each identical with the shift register, the m shift registers sequentially output the state signal in the first state for each one of the plurality of scanning signal lines, the state signal that is outputted from a bistable circuit of a k-th stage after the bistable circuit concerned is provided to each bistable circuit in an entire shift register array which includes the m shift registers, as the first node turn-off signal, and a relationship between m and k satisfies the following equation:

$$m+1 \leq k \leq 2m-1,$$

where m is an integer equal to or larger than two.

According to an eighth aspect of the present invention, in the seventh aspect of the present invention, timings when output of the state signal in the first state is performed from the m shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to m horizontal scanning periods.

According to a ninth aspect of the present invention, in the seventh aspect of the present invention, a wiring for a signal to be provided to each bistable circuit as the first node turn-off signal is formed to branch from a wiring for a signal to be provided to a bistable circuit of a (k−m)-th stage after the bistable circuit concerned as the output node turn-off signal.

According to a tenth aspect of the present invention, in the first aspect of the present invention, a wiring for transmitting a plurality of drive signals for operating the plurality of shift registers are provided in common to the plurality of shift registers, the plurality of drive signals including the plurality of clock signals.

According to an eleventh aspect of the present invention, in the first aspect of the present invention, switching elements that are included in each bistable circuit are thin-film transistors that are all in the same channel.

According to a twelfth aspect of the present invention, in the first aspect of the present invention, switching elements that are included in each bistable circuit are thin-film transistors that are made of amorphous silicon.

According to a thirteenth aspect of the present invention, in the first aspect of the present invention, switching elements that are included in each bistable circuit are thin-film transistors that are made of microcrystalline silicon.

According to a fourteenth aspect of the present invention, in the first aspect of the present invention, switching elements that are included in each bistable circuit are thin-film transistors that are made of polycrystalline silicon.

According to a fifteenth aspect of the present invention, in the first aspect of the present invention, switching elements that are included in each bistable circuit are thin-film transistors that are made of oxide semiconductors.

A sixteenth aspect of the present invention is directed to a display device that includes the display unit, and comprises the scanning signal line drive circuit according to the first aspect of the present invention.

A seventeenth aspect of the present invention is directed to a driving method for driving a plurality of scanning signal lines arrayed in a display unit, by a scanning signal line drive circuit including a plurality of shift registers, each shift register including a plurality of bistable circuits having a first state and a second state and connected in series with each other, and each shift register operating based on a plurality of clock signals that cyclically repeat a first level change of changing from a second level to a first level and a second level change of changing from the first level to the second level, and in each shift register, the plurality of bistable circuits sequentially become in the first state by one of the plurality of clock signals being provided to each bistable circuit as a scanning signal line drive clock signal, the method comprising:

a first drive step for changing each bistable circuit from the second state to the first state; and a second drive step for changing each bistable circuit from the first state to the second state, wherein a clock signal of which a change timing of a level is different is provided in each shift register as the scanning signal line drive clock signal, each bistable circuit includes an output node that is connected to the scanning signal line and that outputs a state signal which indicates either one of the first state as an on level and the second state as an off level, an output control switching element having a second electrode to which the scanning signal line drive clock signal is provided and a third electrode connected to the output node, and a first node connected to a first electrode of the output control switching element, and in each bistable circuit, the first drive step includes a first node turn-on step of changing a level of the first node to an on level based on the state signal which is outputted from a bistable circuit of a previous stage of the bistable circuit concerned, and a state signal turn-on step of changing a level of the state signal to an on level based on the first level change of the scanning signal line drive clock signal, the second drive step includes a state signal turn-off step of changing a level of the state signal to an off level based on the second level change of the scanning signal line drive clock signal, and a first node turn-off step of receiving the state signal which is outputted from a bistable circuit of a subsequent stage of the bistable circuit concerned, as a first node turn-off signal, and changing a level of the first node to an off level based on the first node turn-off signal, and after the state signal turn-on step ends, and after the state signal turn-off step is started, the first node turn-off step is started, during a period from a time point after a bistable circuit of a next stage of the bistable circuit concerned in a shift register that includes the bistable circuit concerned completes the state signal turn-on step till a time point when the scanning signal line drive clock signal performs the first level change.

According to an eighteenth aspect of the present invention, in the seventeenth aspect of the present invention, the scanning signal line drive circuit comprises two shift registers each identical with the shift register, the two shift registers alternately output the state signal in the first state for each one of the plurality of scanning signal lines, and the state signal that is outputted from a bistable circuit of a third stage after the bistable circuit concerned is provided to each bistable circuit in an entire shift register array which includes the two shift registers, as the first node turn-off signal.

According to a nineteenth aspect of the present invention, in the eighteenth aspect of the present invention, timings when output of the state signal in the first state is performed from the two shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to two horizontal scanning periods.

According to a twentieth aspect of the present invention, in the seventeenth aspect of the present invention, the scanning signal line drive circuit comprises m shift registers each identical with the shift register, the m shift registers sequentially output the state signal in the first state for each one of the plurality of scanning signal lines, the state signal that is outputted from a bistable circuit of a k-th stage after the bistable circuit concerned is provided to each bistable circuit in an entire shift register array which includes the m shift registers, as the first node turn-off signal, and a relationship between m and k satisfies the following equation:

$$m+1 \leq k \leq 2m-1,$$

where m is an integer equal to or larger than two.

According to a twenty-first aspect of the present invention, in the twentieth aspect of the present invention, timings when output of the state signal in the first state is performed from the m shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to m horizontal scanning periods.

Effects of the Invention

According to the first aspect of the present invention, in each of the bistable circuit of the plurality of shift registers that constitute the scanning signal line drive circuit, a first node is maintained in a state of an on level, during a period corresponding to a phase difference of each of the shift registers, after a potential of an output node starts decreasing based on a change of a scanning signal line drive clock signal from a first level to a second level. Therefore, the output control switching element is maintained in an on state, during the period corresponding to the phase difference of each of the shift registers, after the potential of the output node starts decreasing. Accordingly, an effect of a decrease in a potential of the output node based on a change of a level of the scanning signal line drive clock signal is sufficiently obtained. Therefore, a potential of a scanning signal that is outputted from each output node quickly decreases to an off level, after a selected period of a corresponding scanning signal line ends. As a result, occurrence of a display failure attributable to a color mixture between a color to be displayed in a certain row and a color to be displayed in a next row, for example, can be prevented. Further, because a period in which the output control switching element is maintained in an on state becomes long, occurrence of a display failure attributable to a waveform distortion of a scanning signal can be prevented, even when a load capacitance of a scanning signal line increases based on an increase in a size of a panel, and the like.

According to the second aspect of the present invention, turn-off of an output node by an output node turn-off unit is started, before turn-off of the first node by a first node turn-off unit is started. Therefore, a potential of the output node decreases more quickly. As a result, occurrence of a display failure is effectively prevented.

According to the third aspect of the present invention, a potential of a second node can be set to an on level every predetermined period by using a clock signal, during a period in which a potential of the first node is at an off level. Accordingly, a first node control switching element becomes in an on state every predetermined period, during a period in which a potential of the first node is at the off level. Therefore, even when a shift occurs in a threshold voltage of an output control switching element and a leakage current of the switching element becomes large, for example, a potential of the first node can be securely set to an off level every predetermined period, and output of an abnormal pulse from an output node can be suppressed.

According to the fourth aspect of the present invention, a period in which each bistable circuit should be maintained in a first state becomes an on period of a shift register output. Turn-off of the first node is started after a period in which a phase difference between two shift registers is added to an on period of a shift register output after each bistable circuit changes from the second state to the first state. Therefore, the first node is maintained in a state of an on level in a relatively long period, and an effect of a decrease in a potential of an output node based on a change of a level of a scanning signal line drive clock signal is sufficiently obtained, in a similar manner to that of the first aspect of the present invention.

According to the fifth aspect of the present invention, an effect of a decrease in a potential of an output node based on a change of a level of a scanning signal line drive clock signal is sufficiently obtained, in a similar manner to that of the fourth aspect of the present invention, based on arrangement that horizontal scanning periods of even-order stages and odd-order stage of the shift register are equal.

According to the sixth aspect of the present invention, an effect similar to that of the fourth aspect of the present invention is obtained, in the scanning signal line drive circuit that includes the plurality of shift registers which operate based on the four-phase clock signals having phases deviated from each other by 90 degrees.

According to the seventh aspect of the present invention, a period in which each bistable circuit should be maintained in the first state becomes an on period of a shift register. Turn-off of the first node is started after a period in which a phase difference between respective shift registers is added to an on period of a shift register output after each bistable circuit changes from the second state to the first state. Therefore, the first node is maintained in a state of an on level in a relatively long period, and an effect of a decrease in a potential of an output node based on a change of a level of a scanning signal line drive clock signal is sufficiently obtained, in a similar manner to that of the first aspect of the present invention.

According to the eighth aspect of the present invention, an effect of a decrease in a potential of an output node based on a change of a level of a scanning signal line drive clock signal is sufficiently obtained, in a similar manner to that of the seventh aspect of the present invention, based on arrangement that horizontal scanning periods of each stage of the shift register are equal.

According to the ninth aspect of the present invention, an area of a wiring for transmitting the first node turn-off signal can be reduced, and it becomes possible to miniaturize a size of a display device that includes the scanning signal line drive circuit according to the seventh aspect of the present invention.

According to the tenth aspect of the present invention, an area of a wiring for transmitting a drive signal of a shift register can be reduced, and it becomes possible to miniaturize a size of a display device that includes the scanning signal line drive circuit according to the first aspect of the present invention.

According to the eleventh aspect of the present invention, manufacturing cost of a scanning signal line drive circuit can be reduced.

According to the twelfth aspect of the present invention, an effect similar to that of the first aspect of the present invention is obtained, in the scanning signal line drive circuit that employs the thin-film transistor made of amorphous silicon as the switching element.

According to the thirteenth aspect of the present invention, an effect similar to that of the first aspect of the present invention is obtained, in the scanning signal line drive circuit that employs the thin-film transistor made of microcrystalline silicon as the switching element.

According to the fourteenth aspect of the present invention, an effect similar to that of the first aspect of the present invention is obtained, in the scanning signal line drive circuit that employs the thin-film transistor made of polycrystalline silicon as the switching element.

According to the fifteenth aspect of the present invention, an effect similar to that of the first aspect of the present invention is obtained, in the scanning signal line drive circuit that employs the thin-film transistor made of oxide semiconductors as the switching element.

According to the sixteenth aspect of the present invention, it is possible to realize a display device that includes a scanning signal line drive circuit which obtains an effect similar to that of the first aspect of the present invention.

BRIEF DESCRIPTION OF THE DRAWINGS

FIG. 17 is a diagram showing an example of a relationship between the first to sixth gate clock signals and first to fourth clocks in each shift register in the second embodiment.

FIG. 20 is a signal waveform diagram for describing an operation of each stage of a shift register.

MODES FOR CARRYING OUT THE INVENTION

Embodiments of the present invention are described below with reference to the accompanying drawings. In the following description, a gate terminal (a gate electrode) of a thin-film transistor corresponds to a first electrode, a drain terminal (a drain electrode) corresponds to a second electrode, and a source terminal (a source electrode) corresponds to a third electrode. Thin-film transistors that are provided in a bistable circuit are all described as n-channel type thin-film transistors.

1. Concept of Embodiments

Figure 2:
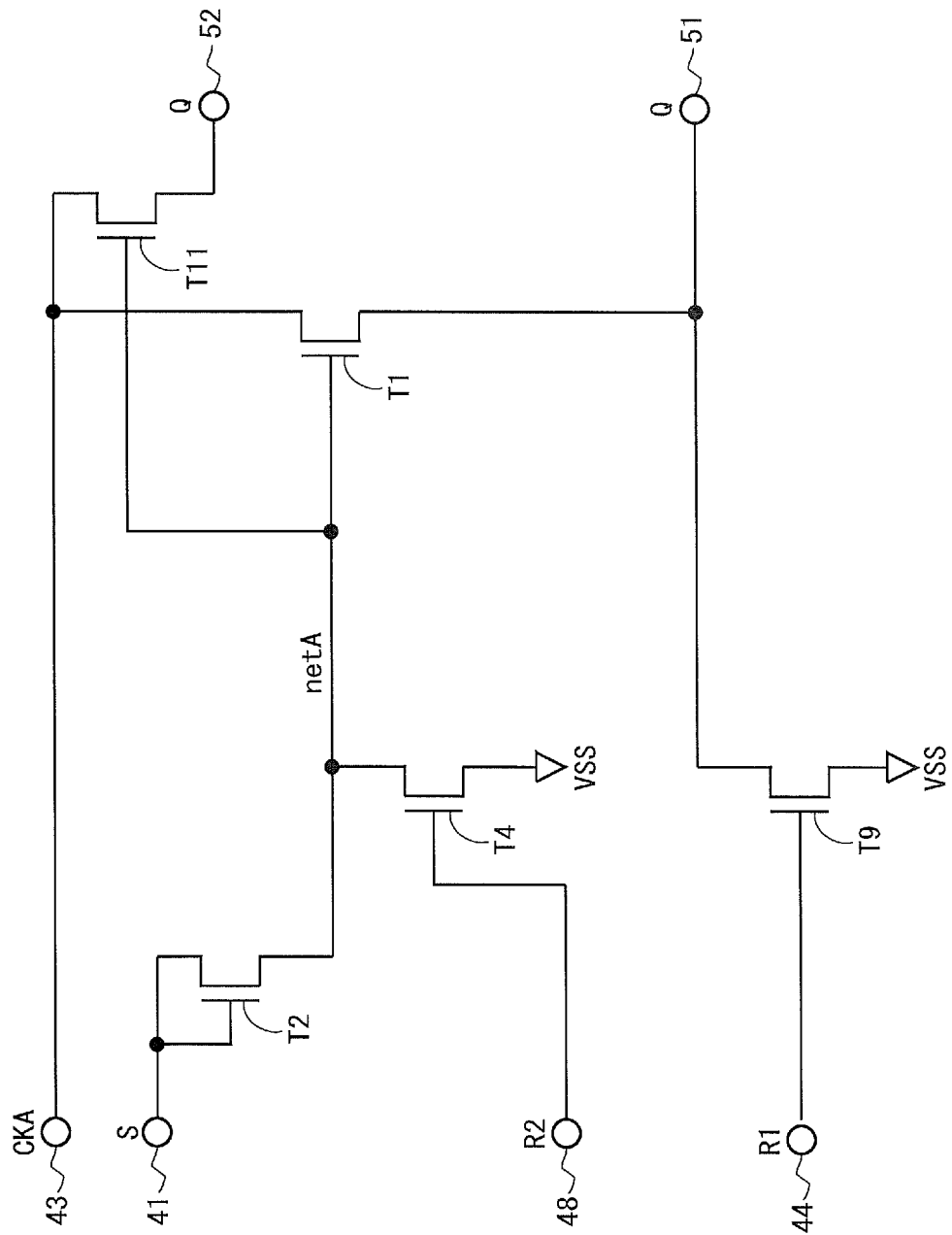
FIG. 2 is a circuit diagram showing a main part of a configuration of a bistable circuit in each embodiment.
Figure 3:
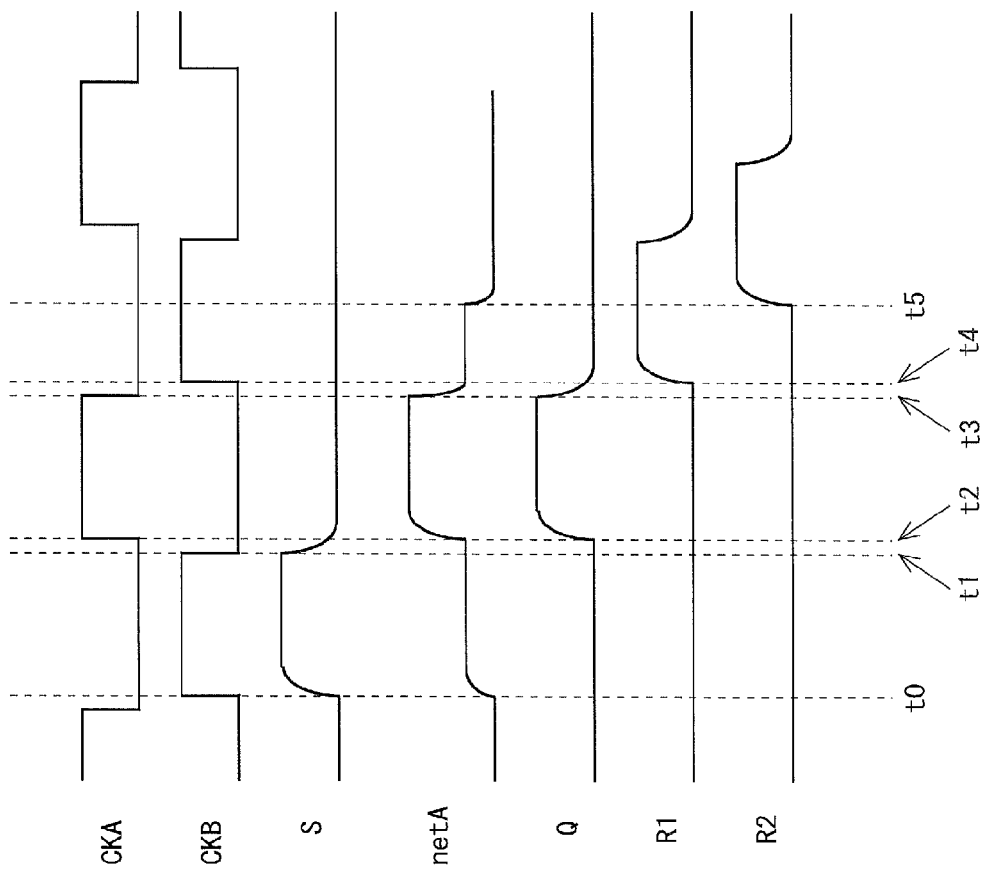
FIG. 3 is a signal waveform diagram for describing an outline of an operation of the bistable circuit in each embodiment.

First, a concept of the embodiments described below is described with reference to FIGS. 2 and 3. FIG. 2 is a circuit diagram showing a main part of a configuration of one stage (a configuration of a bistable circuit) of a shift register in each embodiment. FIG. 3 is a signal waveform diagram for describing an outline of an operation of the bistable circuit.

As shown in FIG. 2, a bistable circuit includes five thin-film transistors T1, T2, T4, T9, and T11. The bistable circuit also has four input terminals 41, 43, 44, and 48 and two output terminals 51, 52, in addition to an input terminal for a low-level power source voltage VSS. A gate terminal of the thin-film transistor T1, a gate terminal of the thin-film transistor T11, a source terminal of the thin-film transistor T2, and a drain terminal of the thin-film transistor T4 are connected to each other. A region (a wiring) in which these terminals are connected to each other is called a "netA" (a first node) for the sake of convenience.

As for the thin-film transistor T1, the gate terminal is connected to the netA, a drain terminal is connected to the input terminal 43, and a source terminal is connected to the output terminal 51. As for the thin-film transistor T2, a gate terminal and a drain terminal are connected to the input terminal 41 (that is, in a diode connection), and the source terminal is connected to the netA. As for the thin-film transistor T4, a gate terminal is connected to the input terminal 48, the drain terminal is connected to the netA, and a source terminal is connected to the power source voltage VSS. As for the thin-film transistor T9, agate terminal is connected to the input terminal 44, a drain terminal is connected to the output terminal 51, and a source terminal is connected to the power source voltage VSS. As for the thin-film transistor T11, the gate terminal is connected to the netA, a drain terminal is connected to the input terminal 43, and a source terminal is connected to the output terminal 52. In the following embodiments, two output terminals 51, 52 are provided as terminals for outputting the state signals Q. However, the present invention is not limited thereto, and the configuration may be such that one output terminal 51 is provided.

In the above configuration, the bistable circuit operates as follows (see FIG. 3). When reaching the time point t0, the set signal S changes from a low level to a high level. Accordingly, the thin-film transistor T2 becomes in an on state, a potential of the netA changes from a low level to a high level. As a result, the thin-film transistors T1, T11 become in an on state. However, during a period from the time point t0 to the time point t2, the first clock CKA is at a low level, and therefore, the state signal Q is maintained at the low level.

After the second clock CKB changes from a high level to a low level at the time point t1, when reaching the time point t2, the first clock CKA changes from a low level to a high level.

At this time, because the thin-film transistors T1, T11 are in an on state, potentials of the state signals Q (potentials of the output terminals 51, 52) increase with an increase in a potential of the input terminal 43. Accordingly, a gate bus line that is connected to the output terminal 51 of this bistable circuit becomes in a selected state. When reaching the time point t3, the first clock CKA changes from a high level to a low level. At this time, because the thin-film transistors T1, T11 are in the on state, a current flows between the source and the drain of the thin-film transistors T1, T11 with a decrease in the potential of the input terminal 43, and the potentials of the state signals Q (potentials of the output terminals 51, 52) decrease.

When reaching the time point t4, a first reset signal R1 changes from a low level to a high level. Accordingly, the thin-film transistor T9 becomes in an on state, and a potential of the output terminal 51 decreases. At this time, because a second reset signal R2 is maintained at a low level, the thin-film transistor T4 is in an off state. Therefore, during a period in which the state signal Q changes from a high level to a low level, the potential of the netA is maintained at a high level. Therefore, the thin-film transistor T1 is maintained in the on state at and after the time point t4, and an effect of a decrease in the potential of the state signal Q based on a change of the first clock CKA from a high level to a low level is sufficiently obtained. As a result, the potential of the output terminal 51 quickly decreases to a low level.

When reaching a time point t5, the second reset signal R2 changes from a low level to a high level. Accordingly, the thin-film transistor T4 becomes in an on state, and the potential of the netA changes from the high level to a low level.

As described above, in each embodiment, as the signal for decreasing the potential of the output terminal 51 and the signal for decreasing the potential of the netA, different signals are employed, and a timing when the potential of the netA changes from a high level to a low level is set later than a timing when the potential of the output terminal 51 changes from a high level to a low level. Specifically, in each of the following embodiments, a state signal (a scanning signal) Q for driving a later row than a row driven by a state signal (a scanning signal) Q corresponding to the first reset signal R1 of each bistable circuit is provided to the bistable circuit as the second reset signal R2, such that the potential of the netA decreases based on the second reset signal R2 that changes from a low level to a high level at a later timing than that of the first reset signal R1 for decreasing the potential of the output terminal 51. According to this configuration, a period in which the potential of the netA is maintained at the high level becomes longer than a conventional period, and an effect of the decrease in the potential of the state signal Q based on a change of the first clock CKA from a high level to a low level is sufficiently obtained. Therefore, after a charge period in each row ends, a potential of a scanning signal for driving each row quickly decreases to a low level.

2. First Embodiment

<2.1 Overall Configuration and Operation>

Figure 4:
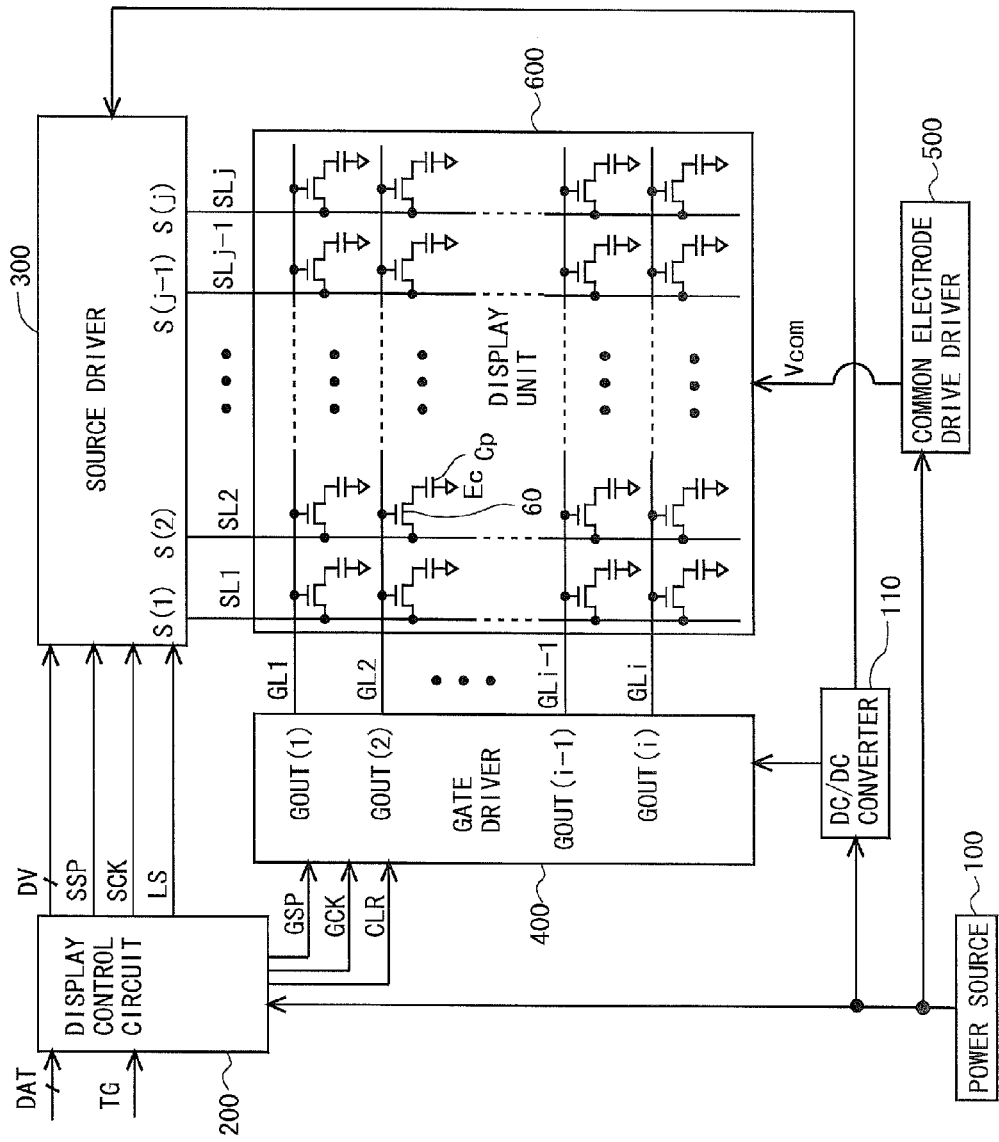
FIG. 4 is a block diagram showing an overall configuration of a liquid crystal display device in the first embodiment.

FIG. 4 is a block diagram showing an overall configuration of an active matrix-type liquid crystal display device according to a first embodiment of the present invention. As shown in FIG. 4, the liquid crystal display device includes a power source 100, a DC/DC converter 110, a display control circuit 200, a source driver (a video signal line drive circuit) 300, a gate driver (a scanning signal line drive circuit) 400, a common electrode drive circuit 500, and a display unit 600. The gate driver 400 is formed on a display panel that includes the display unit 600, by using amorphous silicon or polycrystalline silicon or microcrystalline silicon or oxide semiconductors (IGZO, for example), and so on. That is, in the present embodiment, the gate driver 400 has a monolithic configuration.

The display unit 600 includes a plurality of (j) source bus lines (video signal lines) SL1 to SLj, a plurality of (i) gate bus lines (scanning signal lines) GL1 to GLi, and a plurality of (i×j) pixel formation portions that are provided at respective intersections of the source bus lines SL1 to SLj and the gate bus lines GL1 to GLi. The pixel formation portions constitute a pixel array by being arranged in a matrix shape. Each pixel formation portion includes a thin-film transistor (TFT) 60 which is a switching element having a gate terminal connected to a gate bus line passing through a corresponding intersection and having a source terminal connected to a source bus line passing through the intersection, a pixel electrode that is connected to a drain terminal of the thin-film transistor 60, a common electrode Ec which is a counter electrode that is provided in common to the plurality of pixel formation portions, and a liquid crystal layer that is provided in common to the plurality of pixel formation portions and that is sandwiched between the pixel electrode and the common electrode Ec. A pixel capacitance Cp is formed by a liquid crystal capacitance which is formed by the pixel electrode and the common electrode Ec. Usually, an auxiliary capacitance is provided in parallel with the liquid crystal capacitance, to securely hold a voltage in the pixel capacitance Cp. However, since the auxiliary capacitance is not directly related to the present invention, the description and the drawing of the auxiliary capacitance are omitted.

The power source 100 supplies a predetermined power source voltage to the DC/DC converter 110, the display control circuit 200, and the common electrode drive circuit 500. The DC/DC converter 110 generates a predetermined direct current voltage from the power source voltage to operate the source driver 300 and the gate driver 400, and supplies the direct current voltage to the source driver 300 and the gate driver 400. The common electrode drive circuit 500 applies a predetermined voltage Vcom to the common electrode Ec.

The display control circuit 200 receives an image signal DAT and a timing signal group TG such as a horizontal synchronization signal and a vertical synchronization signal, which are transmitted from the outside, and outputs a digital video signal DV, and a source start pulse signal SSP, a source clock signal SCK, a latch strobe signal LS, a gate start pulse signal GSP, a gate clock signal GCK, and a clear signal CLR which are for controlling an image display of the display unit 600. The gate clock signal GCK is configured by four-phase clock signals GCK1, GCK2, GCK3, and GCK4, as will be described later. The gate start pulse signal GSP is configured by a first gate start pulse signal GSP1, and a second gate start pulse signal GSP2.

The source driver 300 receives the digital video signal DV, the source start pulse signal SSP, the source clock signal SCK, and the latch strobe signal LS that are outputted from the display control circuit 200, and applies drive video signals S(1) to S(j) to the source bus lines SL1 to SLj.

The gate driver 400 repeats application of active scanning signals GOUT(1) to GOUT(i) to the gate bus lines GL1 to GLi, in cycles of one vertical scanning period, based on the gate start pulse signal GSP, the gate clock signal GCK, and the clear signal CLR that are outputted from the display control circuit 200. The gate driver 400 is described in detail later.

As described above, by the drive video signals S(1) to S(j) being applied to the source bus lines SL1 to SLj, and by the scanning signals GOUT(1) to GOUT(i) being applied to the gate bus lines GL1 to GLi, an image based on the image signal DAT transmitted from the outside is displayed in the display unit 600.

<2.2 Configuration and Operation of Gate Driver>

Figure 1:
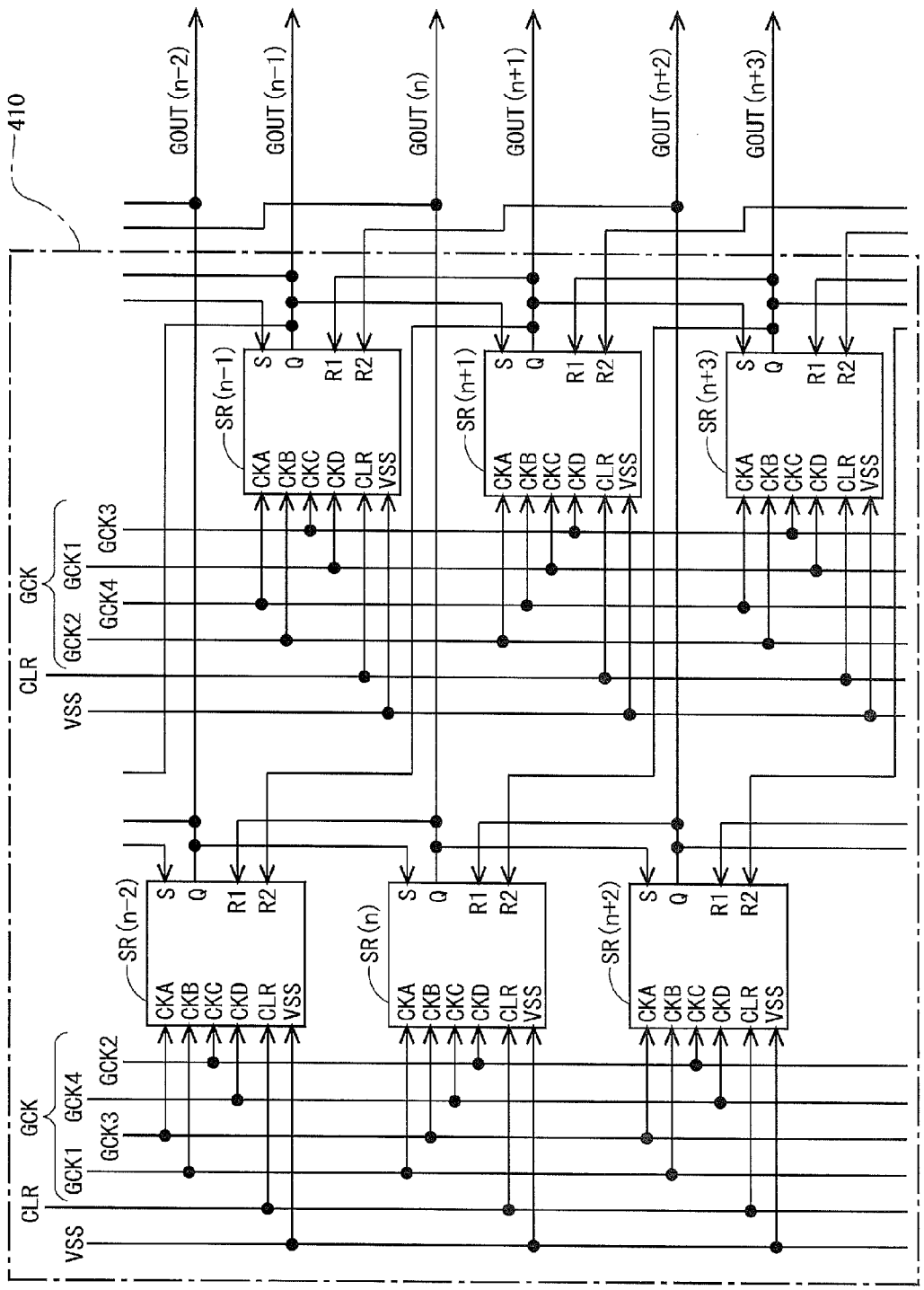
FIG. 1 is a block diagram for describing an "entire shift register" in an active matrix-type liquid crystal display device according to a first embodiment of the present invention.
Figure 5:
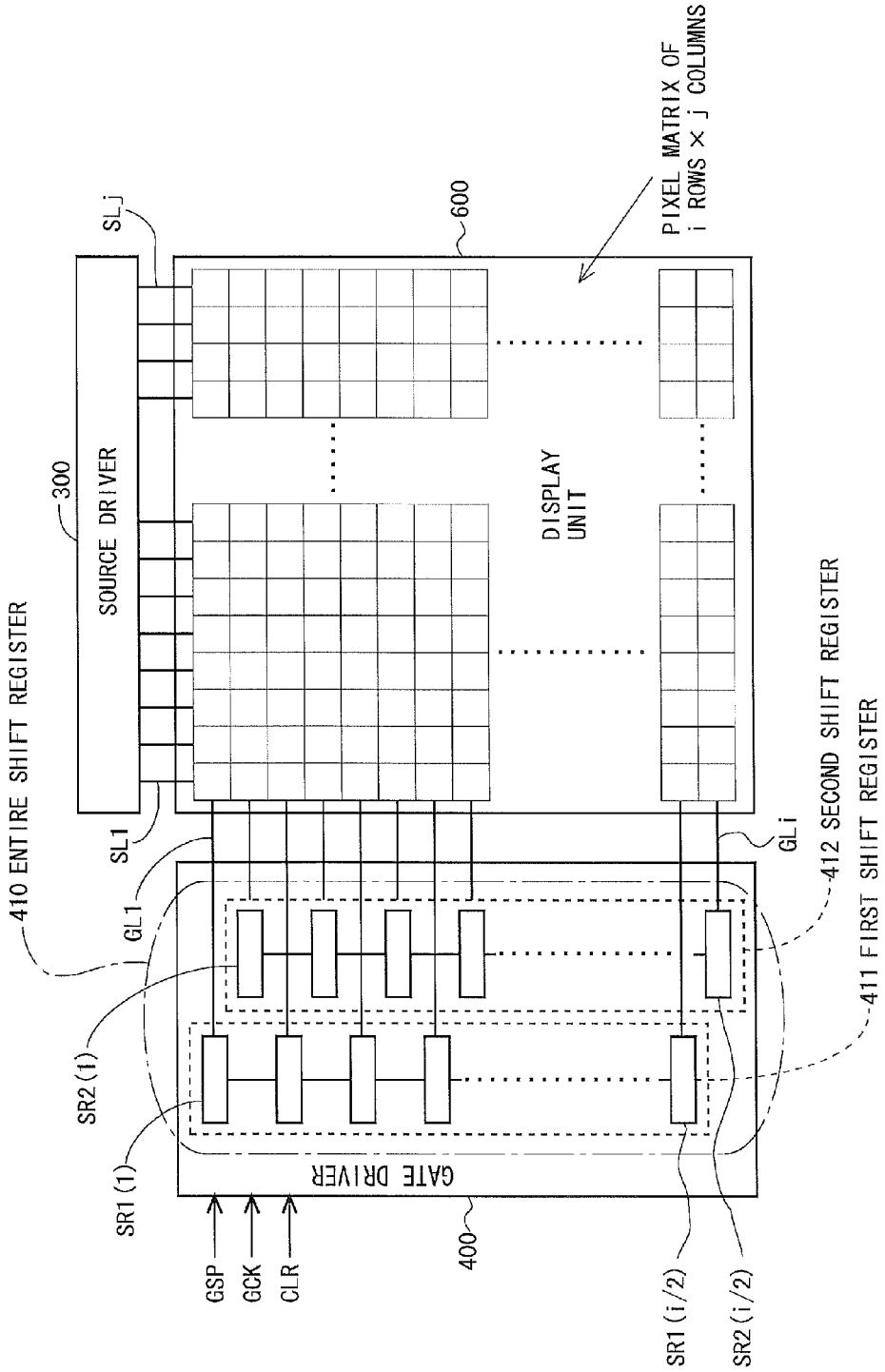
FIG. 5 is a block diagram for describing a configuration of a gate driver in the first embodiment.

A configuration of the gate driver 400 in the present embodiment is described next with reference to FIGS. 1, 5, and 6. As shown in FIG. 5, the gate driver 400 includes two shift registers (a first shift register 411 and a second shift register 412). A pixel matrix of i rows×j columns is formed in the display unit 600. The stages of the first shift register 411 are provided so as to have a one-to-one correspondence with odd-order rows of the pixel matrix, and the stages of the second shift register 412 are provided so as to have a one-to-one correspondence with even-order rows of the pixel matrix. Therefore, each of the first shift register 411 and the second shift register 412 is configured by (i/2) stages. Further, each stage of the first shift register 411 and the second shift register 412 is a bistable circuit that is in either one of two states (a first state and a second state) at each time point and that outputs, as a scanning signal, a signal (a state signal) that indicates the state. In this way, the first shift register 411 is configured by (i/2) bistable circuits SR1(1) to SR1 (i/2), and the second shift register 412 is configured by (i/2) bistable circuits SR2(1) to SR2(i/2). In the present embodiment, when a bistable circuit is in the first state, this bistable circuit outputs a state signal of a high level (H level) as a scanning signal, and when a bistable circuit is in the second state, this bistable circuit outputs a state signal of a low level (L level) as a scanning signal. A state signal that is outputted from each bistable circuit also functions as an other-stage control signal that controls an operation of a bistable circuit of a stage different from a stage of the bistable circuit concerned.

Figure 6:
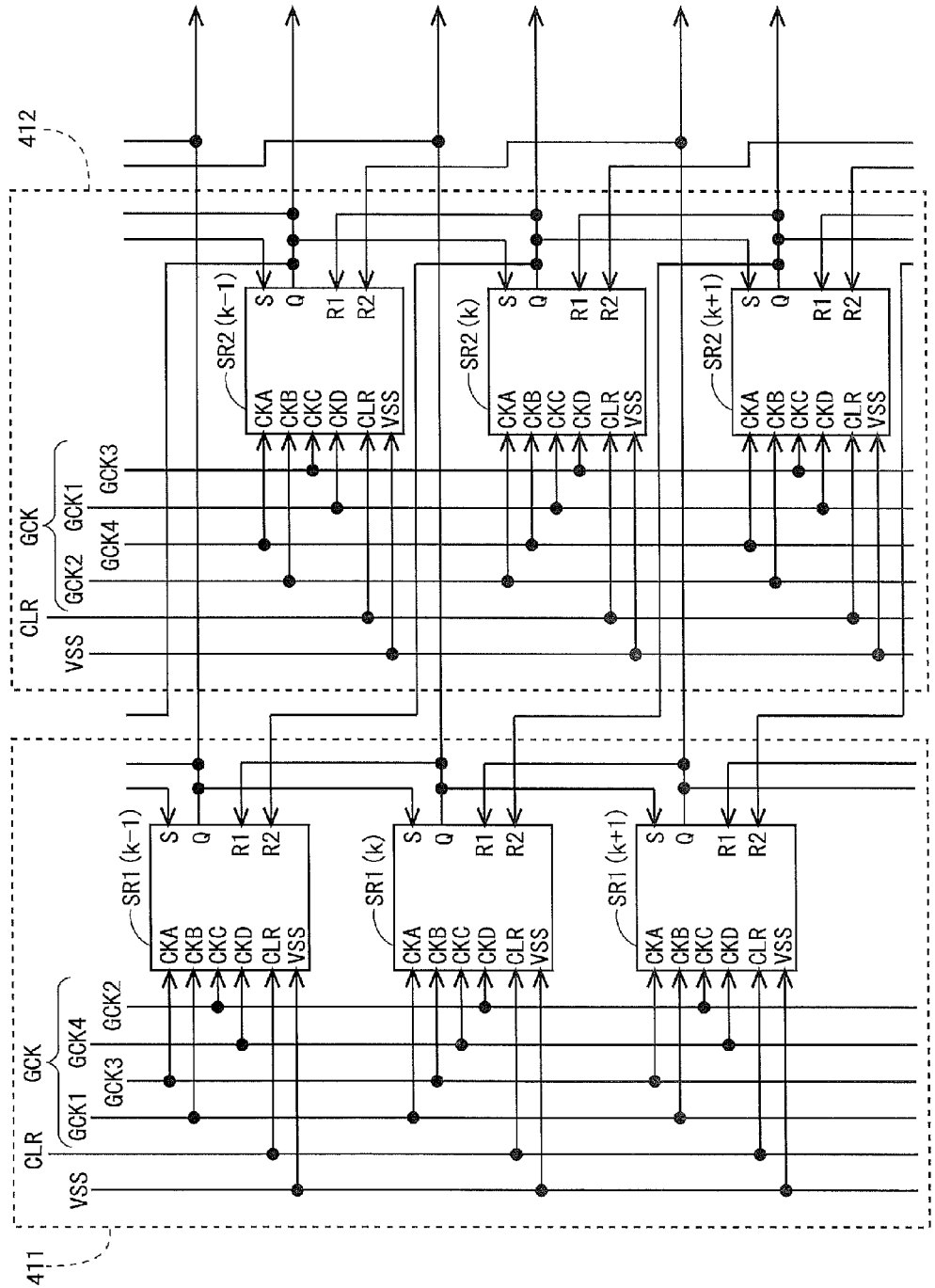
FIG. 6 is a block diagram showing a configuration of shift registers in the gate driver in the first embodiment.

FIG. 6 is a block diagram showing a configuration of the first shift register 411 and the second shift register 412 in the gate driver 400. As shown in FIG. 6, in each bistable circuit, input terminals for receiving each of four-phase clock signals CKA (hereinafter, referred to as a "first clock"), CKB (hereinafter, referred to as a "second clock"), CKC (hereinafter, referred to as a "third clock"), and CKD (hereinafter, referred to as a "fourth clock"), an input terminal for receiving the clear signal CLR, an input terminal for receiving the low-level power source voltage VSS, an input terminal for receiving a set signal S as a scanning start signal, input terminals for receiving each of a first reset signal R1 and a second reset signal R2 as a scanning end signal, and an output terminal for outputting the state signal Q. An output terminal of a bistable circuit in the first shift register 411 is connected to a gate bus line of an odd-order row, and an output terminal of a bistable circuit in the second shift register 412 is connected to a gate bus line of an even-order row.

According to on the above configuration, a gate bus line of an odd-order row is driven by the first shift register 411, and a gate bus line of an even-order row is driven by the second shift register 412. By the first gate start pulse signal GSP1 being provided to a first-stage SR1(1) of the first shift register 411, and by the second gate start pulse signal GSP2 being provided to a first-stage SR2(1) of the second shift register 412, gate bus lines in the display unit 600 are sequentially selected one by one. From the above viewpoint, it can be considered that "the first shift register 411 and the second shift register 412 realize one shift register that sequentially selects each one of the i gate bus lines GL1 to GLi". Therefore, in the following, a configuration that has the first shift register 411 and the second shift register 412 combined together is called an "entire shift register", and the entire shift register is assigned with a reference numeral 410. Note that, as shown in FIG. 1, a reference symbol SR(n) is assigned to an n-th stage bistable circuit of the entire shift register 410.

Figure 7:
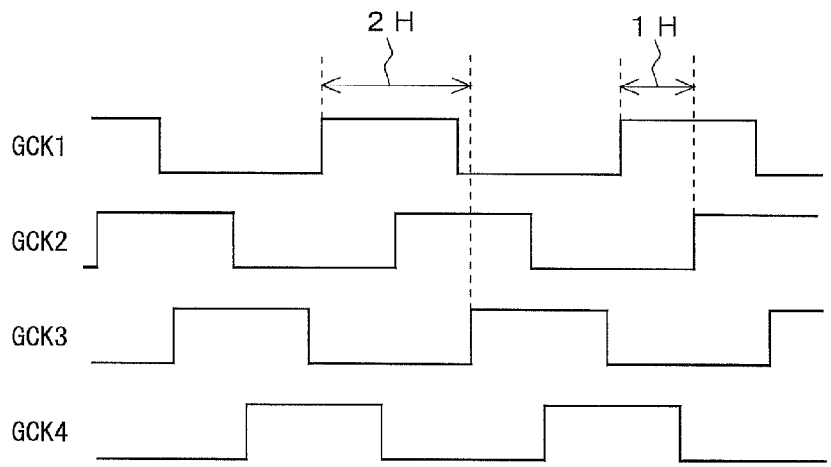
FIG. 7 is a waveform diagram of first to fourth gate clock signals in the first embodiment.

As the gate clock signal GCK, the four-phase clock signals GCK1 (hereinafter, referred to as a "first gate clock signal"), GCK2 (hereinafter, referred to as a "second gate clock signal"), GCK3 (hereinafter, referred to as a "third gate clock signal"), and GCK4 (hereinafter, referred to as a "fourth gate clock signal") are provided to the first shift register 411 and the second shift register 412. As shown in FIG. 7, for each of the first to fourth gate clock signals GCK1 to GCK4, an on period (a period in which a signal is maintained in a high-level state) is approximately two horizontal scanning periods (2H). For each signal, a high level corresponds to a first level, and a low level corresponds to a second level.

A phase of the first gate clock signal GCK1 and a phase of the third gate clock signal GCK3 are deviated from each other by 180 degrees. A phase of the second gate clock signal GCK2 and a phase of the fourth gate clock signal GCK4 are deviated from each other by 180 degrees. The phase of the first gate clock signal GCK1 is advanced by 90 degrees from the phase of the second gate clock signal GCK2. A phase difference of the 90 degrees corresponds to approximately one horizontal scanning period (1H).

Signals that are provided to the input terminals of each stage (each bistable circuit) are as follows (see FIG. 6). In the first shift register 411, one of the first gate clock signal GCK1 and the third gate clock signal GCK3 is provided as the first clock CKA, and the other is provided as the second clock CKB. When the third gate clock signal GCK3 is provided as the first clock CKA in an odd-order stage, for example, the first gate clock signal GCK1 is provided as the first clock CKA in an even-order stage. In the first shift register 411, one of the second gate clock signal GCK2 and the fourth gate clock signal GCK4 is provided as the third clock CKC, and the other is provided as the fourth clock CKD. In the second shift register 412, one of the second gate clock signal GCK2 and the fourth gate clock signal GCK4 is provided as the first clock CKA, and the other is provided as the second clock CKB. In the second shift register 412, one of the first gate clock signal GCK1 and the third gate clock signal GCK3 is provided as the third clock CKC, and the other is provided as the fourth clock CKD. The clear signal CLR and the low-level power source voltage VSS are commonly provided to all bistable circuits.

Figure 8:
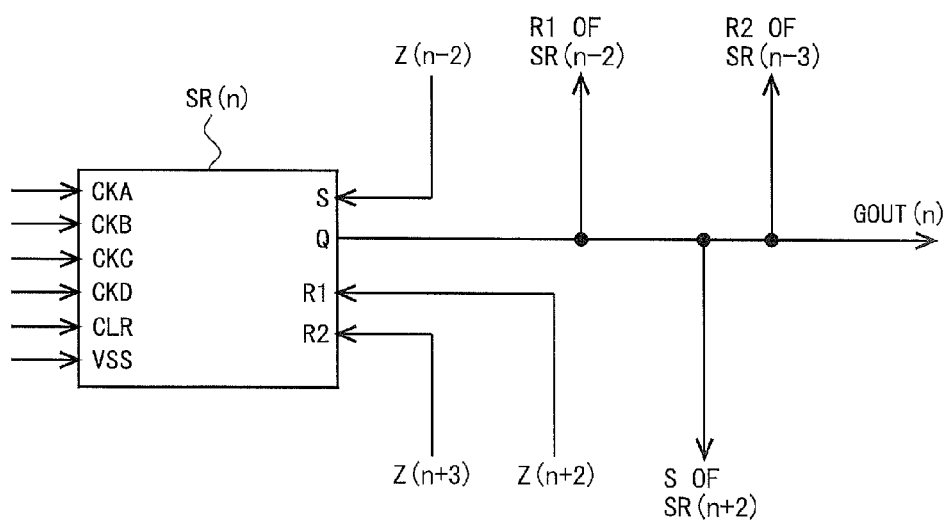
FIG. 8 is an explanatory diagram of input/output signals of an n-th stage bistable circuit of the entire shift register in the first embodiment.

The set signal S, the first reset signal R1, and the second reset signal R2 are as follows (see FIG. 8). When an n-th stage SR(n) of the entire shift register 410 is focused, an other-stage control signal Z(n−2) that is outputted from a second stage before is provided as the set signal S, an other-stage control signal Z(n+2) that is outputted from a second stage after is provided as the first reset signal R1, and an other-stage control signal Z(n+3) that is outputted from a third stage after is provided as the second reset signal R2. For example, when a seventh stage SR(7) of the entire shift register 410 is focused, an other-stage control signal Z(5) that is outputted from a fifth stage SR(5) is provided as the set signal S, an other-stage control signal Z(9) that is outputted from a ninth stage SR(9) is provided as the first reset signal R1, and an other-stage control signal Z(10) that is outputted from a tenth stage SR(10) is provided as the second reset signal R2. In other words, when a fourth stage SR1(4) of the first shift register 411 is focused, a state signal Q that is outputted from a third stage SR1(3) of the first shift register 411 is provided as the set signal S, a state signal Q that is outputted from a fifth stage SR1(5) of the first shift register 411 is provided as the first reset signal R1, and a state signal Q that is outputted from a fifth stage SR2(5) of the second shift register 412 is provided as the second reset signal R2.

Signals that are outputted from the output terminal of each stage (each bistable circuit) are described next. As shown in FIG. 8, a state signal Q that becomes a drive scanning signal GOUT(n) of a gate bus line GLn of an n-th row is outputted from an output terminal of an n-th stage SR(n) of the entire shift register 410. The state signal Q is provided to an (n−2)-th stage SR(n−2) as the first reset signal R1, is provided to an (n−3)-th stage SR(n−3) as the second reset signal R2, and is provided to an (n+2)-th stage SR(n+2) as the set signal S.

Figure 9:
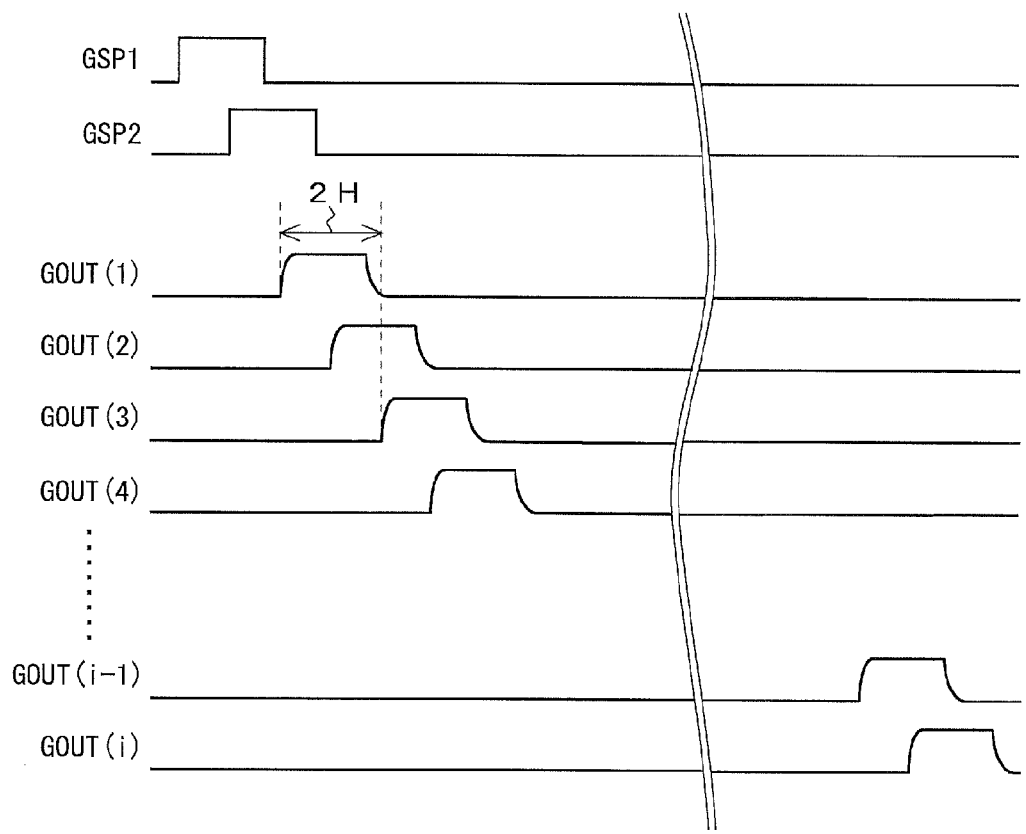
FIG. 9 is a signal waveform diagram for describing an operation of the gate driver in the first embodiment.

In the above configuration, when a pulse of the first gate start pulse signal GSP1 as the set signal S is provided to the first stage SR1(1) of the first shift register 411, and when a pulse of the second gate start pulse signal GSP2 as the set signal S is provided to the first stage SR2(1) of the second shift register 412, the pulse of the first gate start pulse signal GSP1 is sequentially transferred to each stage in the first shift register 411, and the pulse of the second gate start pulse signal GSP2 is sequentially transferred to each stage in the second shift register 412 based on the first to fourth gate clock signals GCK1 to GCK4. Corresponding to a transfer of these pulses, a state signal Q that is outputted from each stage of the entire shift register 410 sequentially becomes at a high level. Accordingly, as shown in FIG. 9, the scanning signals GOUT (1) to GOUT(i) of which a high-level state is maintained during approximately two horizontal scanning periods are sequentially provided to the gate bus lines GL1 to GLi in the display unit 600 approximately every one horizontal scanning period.

In the present embodiment, the first clock CKA corresponds to a scanning signal line drive clock signal, the first reset signal R1 corresponds to an output node turn-off signal, and the second reset signal R2 corresponds to a first node turn-off signal.

<2.3 Configuration of Bistable Circuit>

Figure 10:
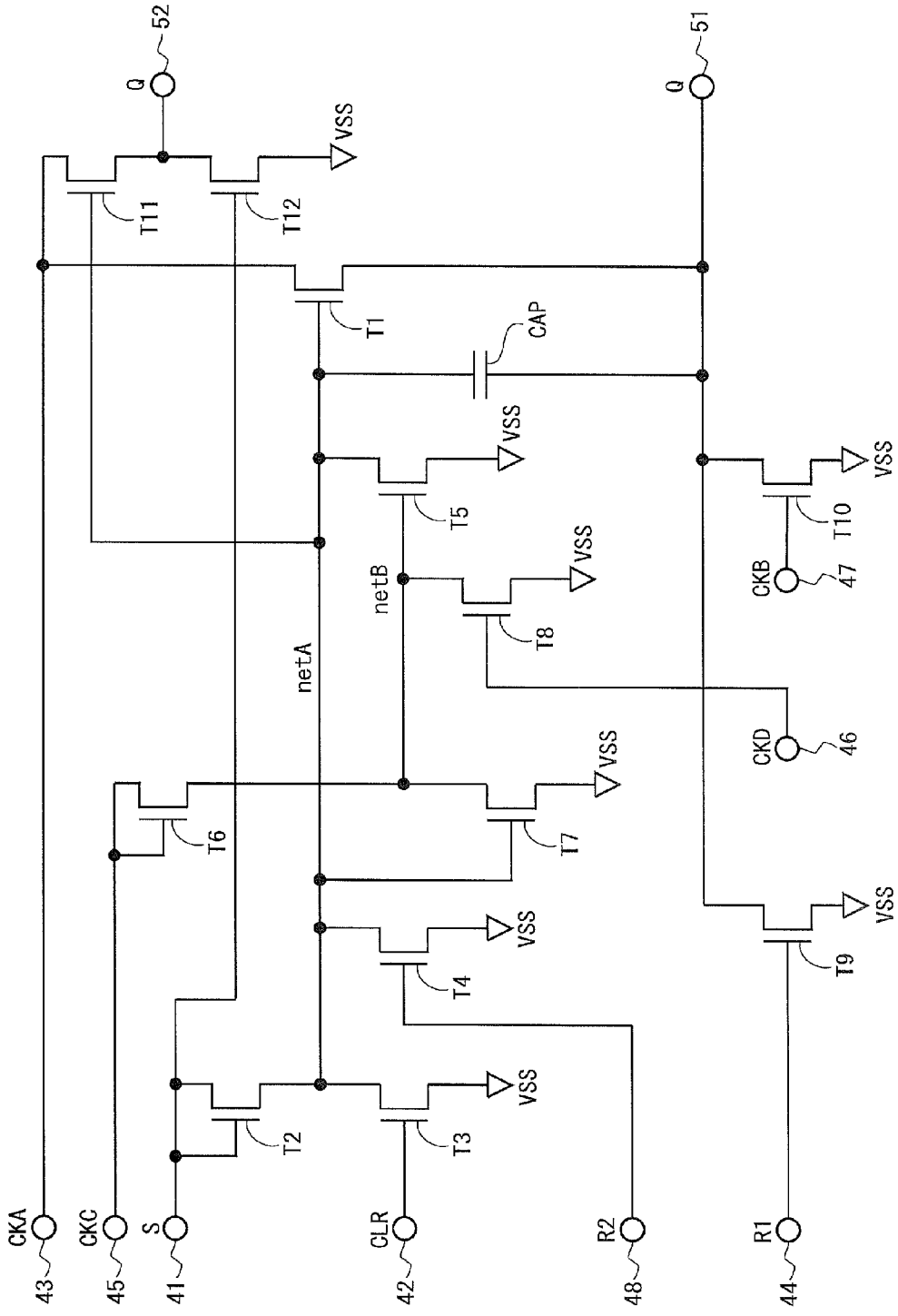
FIG. 10 is a circuit diagram showing a configuration of a bistable circuit that is included in the shift register in the first embodiment.

FIG. 10 is a circuit diagram showing a configuration of a bistable circuit (a configuration of one stage of the first shift register 411 and the second shift register 412) in the present embodiment. As shown in FIG. 10, the bistable circuit includes twelve thin-film transistors T1 to T12, and a capacitor CAP. The bistable circuit has eight input terminals 41 to 48, and two output terminals 51, 52, in addition to an input terminal for the low-level power source voltage VSS. An input terminal that receives the set signal S is assigned with a reference numeral 41, an input terminal that receives the clear signal CLR is assigned with a reference numeral 42, an input terminal that receives the first clock CKA is assigned with a reference numeral 43, an input terminal that receives the first reset signal R1 is assigned with a reference numeral 44, an input terminal that receives the third clock CKC is assigned with a reference numeral 45, an input terminal that receives the fourth clock CKD is assigned with a reference numeral 46, an input terminal that receives the second clock CKB is assigned with a reference numeral 47, and an input terminal that receives the second reset signal R2 is assigned with a reference numeral 48. An output terminal that outputs the state signal Q as the scanning signal GOUT is assigned with a reference numeral 51, and an output terminal that outputs the state signal Q as the other-stage control signal Z is assigned with a reference numeral 52.

Connection relationships between constituent elements in the bistable circuit are described next. A gate terminal of the thin-film transistor T1, a source terminal of the thin-film transistor T2, a drain terminal of the thin-film transistor T3, a drain terminal of the thin-film transistor T4, a drain terminal of the thin-film transistor T5, a gate terminal of the thin-film transistor T7, and a gate terminal of the thin-film transistor T11 are connected to each other. A region (a wiring) in which these terminals are connected to each other is called a "netA" (a first node) for the sake of convenience. A gate terminal of the thin-film transistor T5, a source terminal of the thin-film transistor T6, a drain terminal of the thin-film transistor T7, and a drain terminal of the thin-film transistor T8 are connected to each other. A region (a wiring) in which these terminals are connected to each other is called a "netB" (a second node) for the sake of convenience.

As for the thin-film transistor T1, the gate terminal is connected to the netA, a drain terminal is connected to the input terminal 43, and a source terminal is connected to the output terminal 51. As for the thin-film transistor T2, a gate terminal and a drain terminal are connected to the input terminal 41 (that is, in a diode connection), and the source terminal is connected to the netA. As for the thin-film transistor T3, a gate terminal is connected to the input terminal 42, the drain terminal is connected to the netA, and a source terminal is connected to the power source voltage VSS. As for the thin-film transistor T4, a gate terminal is connected to the input terminal 48, the drain terminal is connected to the netA, and a source terminal is connected to the power source voltage VSS. As for the thin-film transistor T5, the gate terminal is connected to the netB, the drain terminal is connected to the netA, and a source terminal is connected to the power source voltage VSS.

As for the thin-film transistor T6, a gate terminal and a drain terminal are connected to the input terminal 45 (that is, in a diode connection), and the source terminal is connected to the netB. As for the thin-film transistor T7, the gate terminal is connected to the netA, the drain terminal is connected to the netB, and a source terminal is connected to the power source voltage VSS. As for the thin-film transistor T8, a gate terminal is connected to the input terminal 46, the drain terminal is connected to the netB, and a source terminal is connected to the power source voltage VSS. As for the thin-film transistor T9, a gate terminal is connected to the input terminal 44, a drain terminal is connected to the output terminal 51, and a source terminal is connected to the power source voltage VSS. As for the thin-film transistor T10, a gate terminal is connected to the input terminal 47, a drain terminal is connected to the input terminal 51, and a source terminal is connected to the power source voltage VSS.

As for the thin-film transistor T11, a gate terminal is connected to the netA, a drain terminal is connected to the input terminal 43, and a source terminal is connected to the output terminal 52. As for the thin-film transistor T12, a gate terminal is connected to the input terminal 41, a drain terminal is connected to the output terminal 52, and a source terminal is connected to the power source voltage VSS. As for the capacitor CAP, one end is connected to the netA, and the other end is connected to the output terminal 51.

A function of each constituent element in this bistable circuit is described next. The thin-film transistor T1 provides a potential of the first clock CKA to the output terminal 51, when a potential of the netA is at a high level. The thin-film transistor T2 sets a potential of the netA to a high level, when the set signal S is at a high level. The thin-film transistor T3 sets a potential of the netA to a low level, when the clear signal CLR is at a high level. The thin-film transistor T4 sets a potential of the netA to a low level, when the second reset signal R2 is at a high level. The thin-film transistor T5 sets a potential of the netA to a low level, when a potential of the netB is at a high level. The thin-film transistor T6 sets a potential of the netB to a high level, when the third clock CKC is at a high level. The thin-film transistor T7 sets a potential of the netB to a low level, when a potential of the netA is at a high level. The thin-film transistor T8 sets a potential of the netB to a low level, when the fourth clock CKD is at a high level. The thin-film transistor T9 sets a potential of the output terminal 51 to a low level, when the first reset signal R1 is at a high level. The thin-film transistor T10 sets a potential of the output terminal 51 to a low level, when the second clock CKB is at a high level. The thin-film transistor T11 provides a potential of the first clock CKA to the output terminal 52, when a potential of the netA is at a high level. The thin-film transistor T12 sets a potential of the output terminal 52 to a low level, when the set signal S is at a high level. The capacitor CAP functions as a compensation capacitance to maintain a potential of the netA at a high level during a period in which a gate bus line connected to this bistable circuit is in a selected state.

In the present embodiment, the thin-film transistor T1 realizes an output control switching element, and the thin-film transistor T5 realizes a first node control switching element. The thin-film transistor T2 realizes a first node turn-on unit, the thin-film transistor T4 realizes a first node turn-off unit, the thin-film transistor T9 realizes an output node turn-off unit, and the thin-film transistors T6 to T8 realize a second node control unit.

<2.4 Operation of Bistable Circuit>

Figure 11:
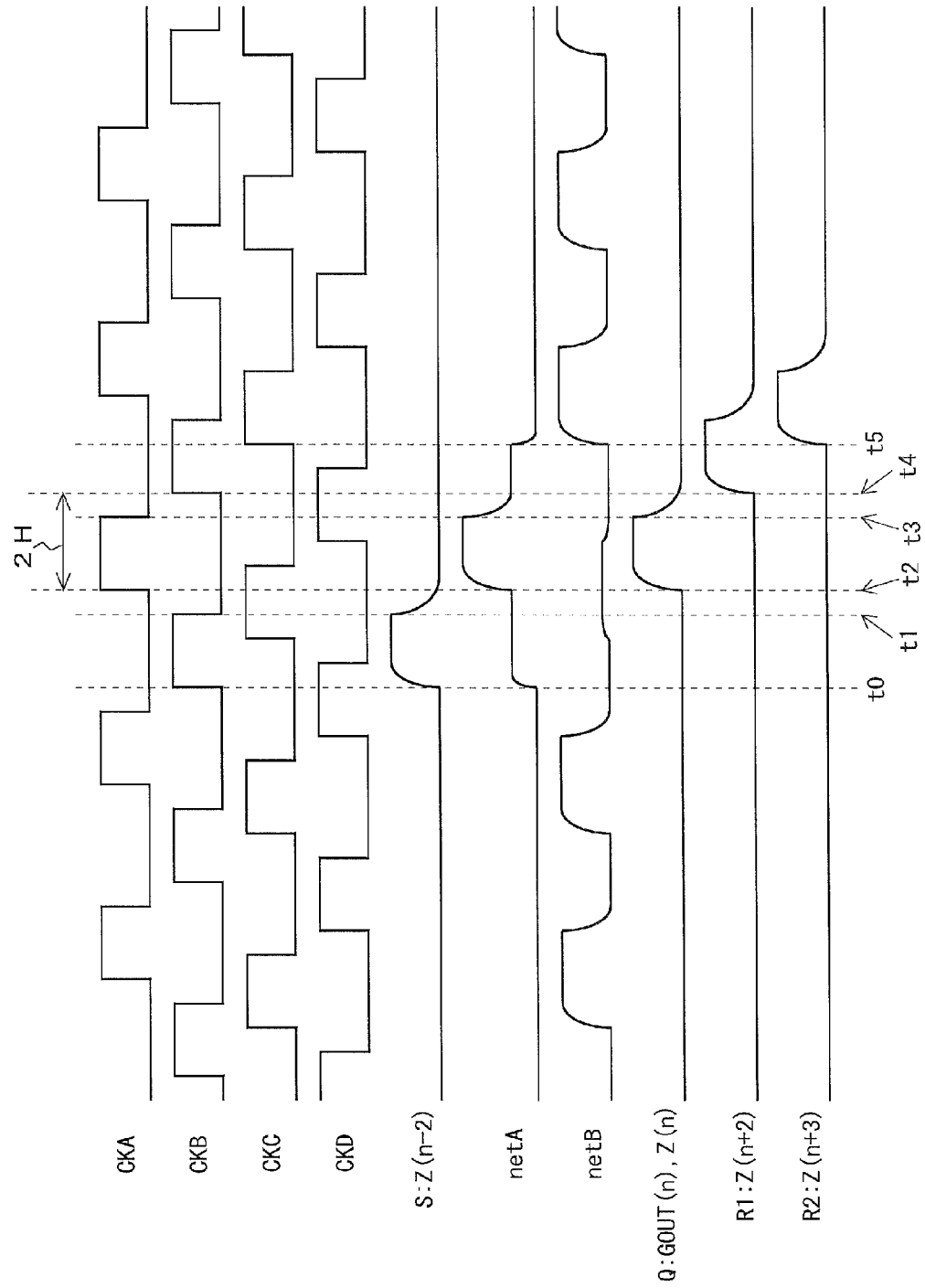
FIG. 11 is a signal waveform diagram for describing an operation of each stage of the shift register in the first embodiment.

An operation of the bistable circuit in the present embodiment is described with reference to FIGS. 10 and 11. During an operation of the liquid crystal display device, the first clock CKA, the second clock CKB, the third clock CKC, and the fourth clock CKD of waveforms as shown in FIG. 11 are provided to the bistable circuit. The clear signal CLR becomes at a high level during a predetermined period every one frame period, and thus a potential of the netA is set to a low level every one frame period in all bistable circuits.

During a period before the time point t0, a potential of the netA and a potential of the state signal Q (potentials of the output terminals 51, 52) are at a low level. During the period before the time point t0, when the third clock CKC changes from a low level to a high level, a potential of the netB changes from a low level to a high level, and when the fourth clock CKD changes from a low level to a high level, a potential of the netB changes from a high level to a low level. In this way, a potential of the netB becomes at a high level every predetermined period, and the thin-film transistor T5 becomes in an on state, and therefore, during the period before the time point t0, a potential of the netA is maintained at a low level.

When reaching the time point t0, the set signal S changes from a low level to a high level. Because the thin-film transistor T2 is in a diode connection as shown in FIG. 10, the thin-film transistor T2 becomes in an on state by the set signal S becoming at a high level, and the capacitor CAP is charged. Accordingly, a potential of the netA changes from a low level to a high level, and the thin-film transistors T1, T11 become in an on state. When reaching the time point t1, the set signal S changes from a high level to a low level. Consequently, the thin-film transistor T2 becomes in an off state. At this time, because a potential of the netA is maintained by the capacitor CAP, a potential of the netA does not vary due to the thin-film transistor T2 becoming in the off state.

By the way, during a period from the time point t0 to the time point t2, the first clock CKA is at a low level. Therefore, the state signal Q is maintained at a low level during this period. Because the gate terminal of the thin-film transistor T7 is connected to the netA, the thin-film transistor T7 is maintained in an on state during the period from the time point t0 to the time point t2. Accordingly, during this period, a potential of the netB is maintained at a low level, and as a result, the thin-film transistor T5 is maintained in an off state. Further, during this period, because the second reset signal R2 is maintained at a low level, the thin-film transistor T4 is maintained in an off state. Consequently, a potential of the netA does not decrease during the period from the time point t0 to the time point t2.

When reaching the time point t2, the first clock CKA changes from a low level to a high level. Accordingly, drain potentials of the thin-film transistors T1, T11 increase with an increase in a potential of the input terminal 43. At this time, because the thin-film transistors T1, T11 are in the on state, potentials of the state signals Q (potentials of the output terminals 51, 52) also increase. When a potential of the output terminal 51 increases, a potential of the netA also increases via the capacitor CAP. As a result, a large voltage is applied to the gate terminals of the thin-film transistors T1, T11, and potentials of the state signals Q increase to a level sufficient for the gate bus line connected to the output terminal 51 of this bistable circuit to become in a selected state. Because a state that the first clock CKA is at a high level is maintained to the time point t3, the state signals Q are maintained at a high level during a period from the time point t2 to a time point 3. Therefore, during this period, writing (charge) of a video signal to the pixel capacitance Cp is performed in a pixel formation portion of a row corresponding to a gate bus line that is connected to the output terminal 51 of this bistable circuit.

When reaching the time point t3, the first clock CKA changes from a high level to a low level. At this time, because the thin-film transistors T1, T11 are in the on state, potentials of the state signals Q (potentials of the output terminals 51, 52) also decrease in accordance with the decrease in the potential of the input terminal 43. In accordance with the decrease in the potential of the output terminal 51, a potential of the netA also decreases via the capacitor CAP. However, because the potential of the netA decreases by approximately the decrease of the potential of the output terminal 51, the potential of the netA does not decrease to a low level, and is maintained at a high level.

When reaching the time point t4, the first reset signal R1 and the second clock CKB change from the low level to a high level. Accordingly, the thin-film transistors T9, T10 become in an on state, and the potential of the output terminal 51 decreases. At this time, because the second reset signal R2 is maintained at a low level, the thin-film transistor T4 is in an off state. Accordingly, during a period in which the state signal Q changes from a high level to a low level, the potential of the netA is maintained at a high level. Therefore, the thin-film transistor T1 is maintained at and after the time point t4, and an effect of a decrease in the potential of the state signal Q based on a change of the first clock CKA from a high level to a low level is sufficiently obtained. As a result, the potential of the output terminal 51 quickly decreases to a low level.

When reaching the time point t5, the second reset signal R2 changes from a low level to a high level. Accordingly, the thin-film transistor T4 becomes in an on state, and the potential of the netA changes from the high level to a low level. The third clock CKC changes from a low level to a high level. Because the thin-film transistor T6 is in a diode connection as shown in FIG. 10, the thin-film transistor T6 becomes in an on state by the third clock CKC becoming at a high level, and a potential of the netB changes from a low level to a high level. Because the thin-film transistor T5 becomes in an on state accordingly, the potential of the netA securely becomes at a low level.

During a period after the time point t5, an operation similar to that during the period before the time point t0 is repeated until the set signal S changes from a low level to a high level next.

In the present embodiment, a first node turn-on step is realized by a change of a level of a start signal S at the time point t0, a state signal turn-on step is realized by a change of a level of the first clock CKA at the time point t2, a state signal turn-off step is realized by a change of a level of the first clock CKA at the time point t3, and a first node turn-off step is realized by a change of a level of the second reset signal R2 at the time point t5.

<2.5 Effect>

According to the present embodiment, as shown in FIG. 10, as an output control switching element for controlling the potential of the state signal Q, the thin-film transistor T1 having a gate terminal connected to the netA, a drain terminal connected to the input terminal 43 to which the first clock CKA is provided, and a source terminal connected to the output terminal 51 that outputs the state signal Q, is provided in each stage of the shift register. The potential of the netA is set to a high level based on the set signal S, and is set to a low level based on the second reset signal R2. In this configuration, the other-stage control signal Z(n−2) that is outputted from the stage SR(n−2) which is before two stages is provided as the set signal S, to each stage SR(n) of the entire shift register 410. The four-phase clock signals (the first to fourth gate clock signals GCK1 to GCK4) having phases deviated from each other by 90 degrees are provided to the entire shift register 410. Each stage SR(n) operates based on a clock signal having a phase delayed by 90 degrees from a phase of a clock signal that is provided to a pre-stage SR(n−1). By the way, in a configuration that includes two shift registers which output the state signals (the scanning signals) Q whose on periods are two horizontal scanning periods, when the potential of the netA is decreased from a high level to a low level based on the other-stage control signal Z(n+2) that is outputted from the stage SR(n+2) which is a second stage after, for example, in each stage SR(n) of the entire shift register 410, the potential of the netA decreases to a low level before the potential of the state signal Q sufficiently decrease. Therefore, an effect of the decrease in potentials of the state signals Q based on a change of the first clock CKA from a high level to a low level is not sufficiently obtained, and the potential of the state signal Q does not quickly decrease to a low level. In this respect, according to the present embodiment, in each stage SR(n) of the entire shift register 410, the other-stage control signal Z(n+3) that is outputted from the stage SR(n+3) which is a third stage after is provided as a signal (the second reset signal R2) for decreasing a potential of the netA to a low level. Therefore, the period in which the potential of the netA is maintained at the high level becomes long, and an effect of the decrease in the potential of the state signal Q based on a change of the first clock CKA from a high level to a low level is sufficiently obtained. That is, after a charge period in each row ends, a potential of the scanning signal quickly decreases to a low level. As a result, occurrence of a display failure attributable to a color mixture between a color to be displayed in a certain row and a color to be displayed in the next row can be prevented. Because the period in which the potential of the netA is maintained at the high level becomes long, occurrence of a display failure attributable to a waveform distortion of a scanning signal can be prevented, even when a load capacitance of a gate bus line increases based on an increase in a size of a panel.

According to the present embodiment, when the thin-film transistor T5 that is controlled by a potential of the netA, a potential of the third clock CKC, and a potential of the fourth clock CKD becomes in an on state, a potential of the netA becomes at a low level. Therefore, even when a leakage current of the thin-film transistor T1 becomes large based on occurrence of a shift of a threshold voltage of the thin-film transistor T1, for example, a potential of the netA can be securely set to a low level every predetermined period, and output of an abnormal pulse from the output terminal 51 can be suppressed.

Figure 12A:
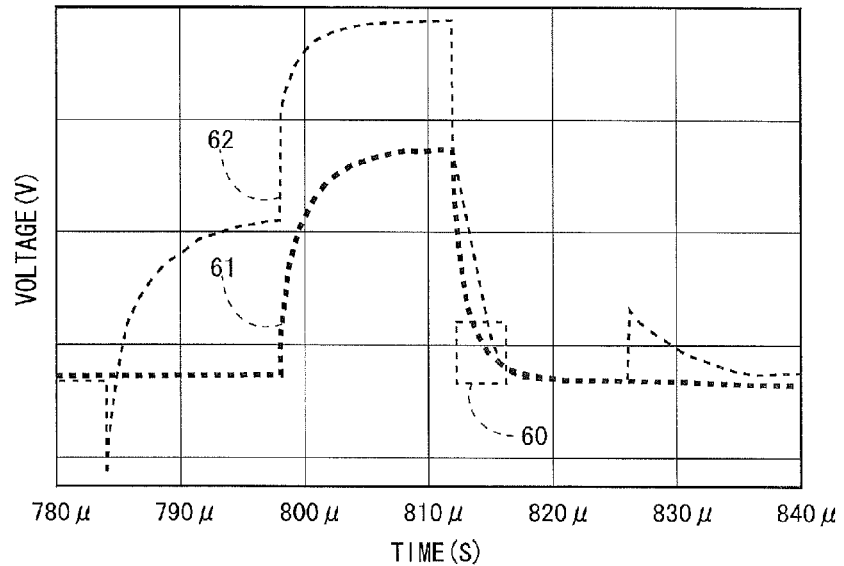
FIGS. 12A and 12B are explanatory diagrams of an effect of the first embodiment.
Figure 12B:
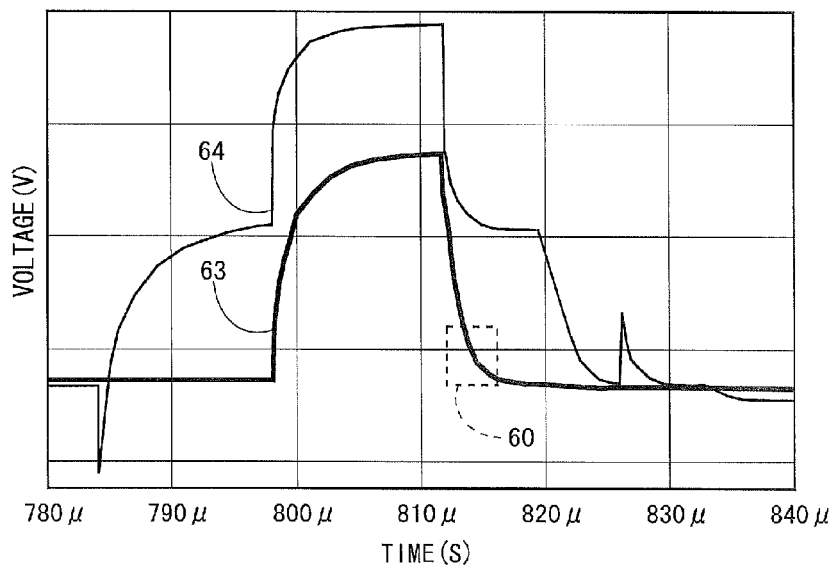
Figure 13:
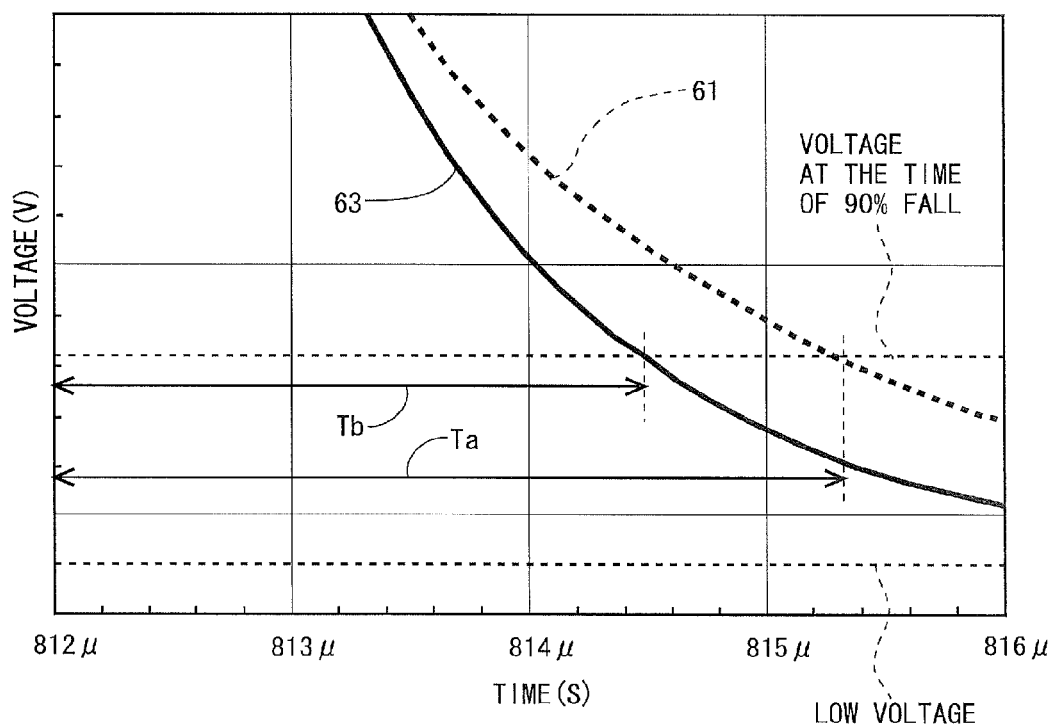
FIG. 13 is an explanatory diagram of an effect of the first embodiment.

An effect of the present embodiment is described next based on a simulation result. FIG. 12A is a signal waveform diagram of a conventional example, and FIG. 12B is a signal waveform diagram of the present embodiment. In FIG. 12A, a thick dotted line of a reference numeral 61 indicates a waveform of a scanning signal, and a thin dotted line of a reference numeral 62 indicates a waveform of the netA. In FIG. 12B, a thick solid line of a reference numeral 63 indicates a waveform of a scanning signal, and a thin solid line of a reference numeral 64 indicates a waveform of the netA. FIG. 13 is an enlarged diagram of a part indicated by a reference numeral 60 in FIGS. 12A and 12B. As can be understood from FIGS. 12A and 12B, in the present embodiment, a period in which a potential of the netA is maintained at a high level is longer than that in the conventional example. As a result, as shown in FIG. 13, although a time Ta required for a scanning signal to fall by 90 percent is 3.4 µs in the conventional example, a time Tb required for a scanning signal to fall by 90 percent is 2.5 µs in the present embodiment. That is, in the present embodiment, a time required for a scanning signal to fall is shortened by about 26 percent, as compared with the conventional example. In this way, according to the present embodiment, a scanning signal falls quickly after a charge period in each row ends, as compared with the conventional example.

<2.6 Modification>

Figure 14:
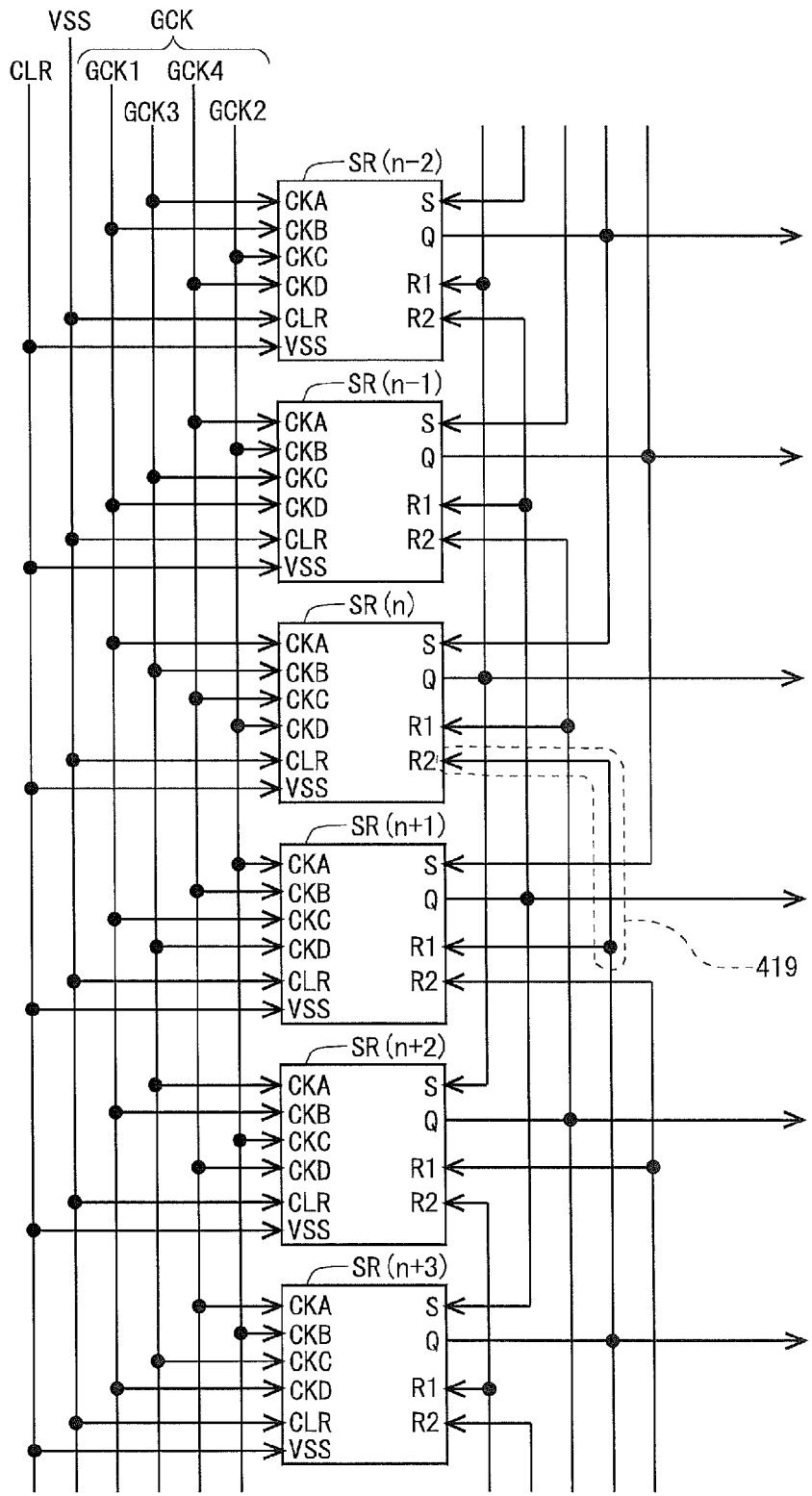
FIG. 14 is a block diagram showing a configuration of a shift register in a gate driver in a modification of the first embodiment.

In the first embodiment, wirings for the first to fourth gate clock signals GCK1 to GCK4, a wiring for the clear signal CLR, and a wiring for the low-level power source voltage VSS are provided in each of the first shift register 411 and the second shift register 412. However, the present invention is not limited to this. For example, by arranging each stage of the entire shift register as shown in FIG. 14, wirings for the first to fourth gate clock signals GCK1 to GCK4, a wiring for the clear signal CLR, and a wiring for the low-level power source voltage VSS can be set as one line, respectively. With this, a wiring area for a drive signal of the shift register can be reduced, and the display device can be miniaturized.

Further, for example, regarding a wiring for the second reset signal R2 of an n-th stage, the wiring for the second reset signal R2 of the n-th stage may be formed to branch from a wiring for the first reset signal R1 of an (n+1)-th stage, as indicated by a reference numeral 419 in FIG. 14. According to this configuration, a length of the wiring for the second reset signal R2 can be set relatively short.

3. Second Embodiment

<3.1 Configuration of Shift Register>

Figure 15:
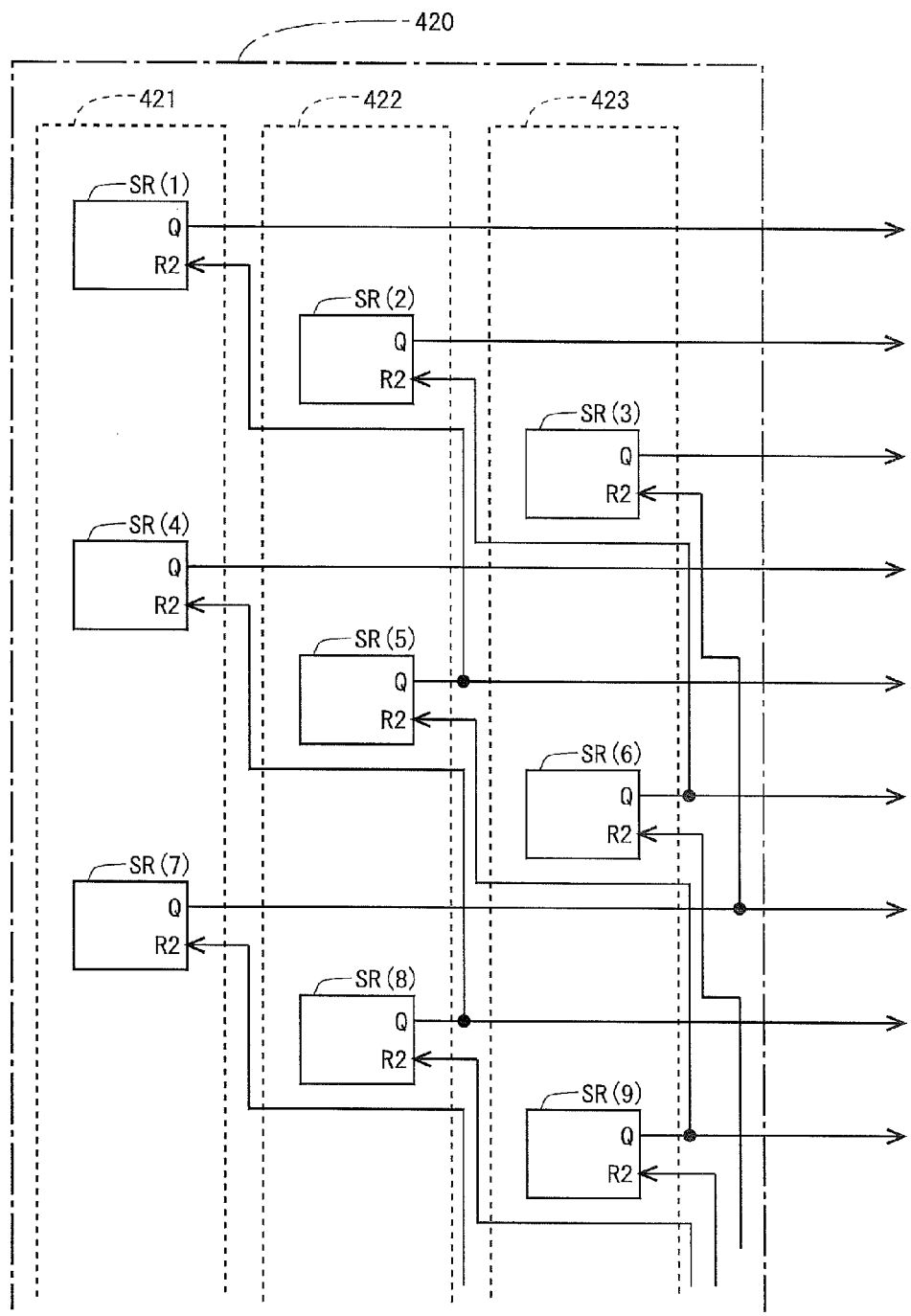
FIG. 15 is a block diagram showing a schematic configuration of a shift register in a gate driver of an active matrix-type liquid crystal display device according to a second embodiment of the present invention.

FIG. 15 is a block diagram showing a schematic configuration of a shift register in a liquid crystal display device according to a second embodiment of the present invention. An overall configuration of the liquid crystal display device is similar to that of the first embodiment, and therefore, its description is omitted (see FIG. 4). In the first embodiment, the gate driver 400 includes two shift registers. On the other hand, in the present embodiment, the gate driver 400 includes three shift registers (a first shift register 421, a second shift register 422, and a third shift register 423). That is, as shown in FIG. 15, the first shift register 421, the second shift register 422, and the third shift register 423 realize an entire shift register 420 for sequentially driving each one of the gate bus lines GL1 to GLi in the display unit 600.

In a similar manner to that of the first embodiment, in each bistable circuit, there are provided input terminals for receiving the four-phase clock signals CKA, CKB, CKC, and CKD respectively, an input terminal for receiving the clear signal CLR, an input terminal for receiving the low-level power source voltage VSS, an input terminal for receiving the set signal S, an input terminal for receiving the first reset signal R1, and input terminal for receiving the second reset signal R2, and an output terminal for outputting the state signal Q. However, for the sake of convenience, FIG. 15 shows only the input terminal for receiving the second reset signal R2, and the output terminal for outputting the state signal Q. A circuit configuration of each bistable circuit is similar to that of the first embodiment (see FIG. 10). An output terminal of a bistable circuit in the first shift register 421 is connected to each of gate bus lines GL1, GL4, GL7, ..., an output terminal of a bistable circuit in the second shift register 422 is connected to each of gate bus lines GL2, GL5, GL8, ..., and an output terminal of a bistable circuit in the third shift register 423 is connected to each of gate bus lines GL3, GL6, GL9, ....

Figure 16:
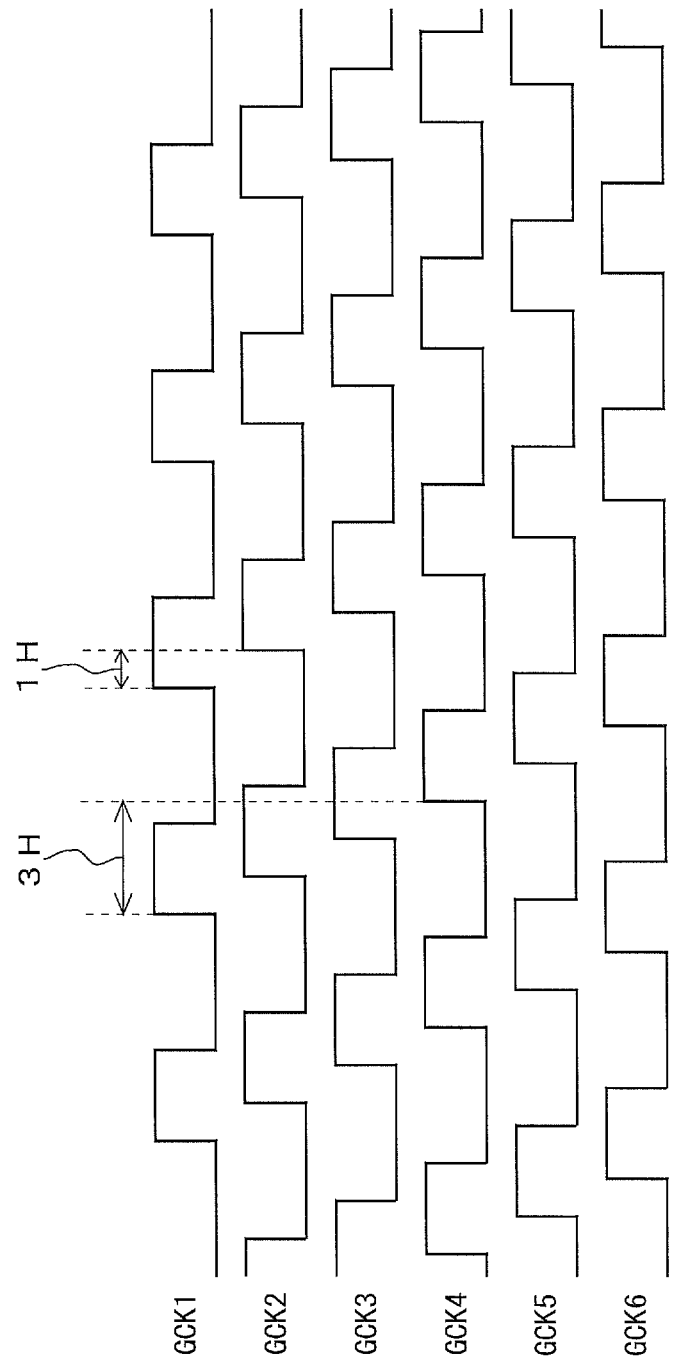
FIG. 16 is a waveform diagram of first to sixth gate clock signals in the second embodiment.

In the present embodiment, first to sixth gate clock signals GCK1 to GCK6 which are six-phase clock signals are provided from the display control circuit 200 to the gate driver 400 (see FIG. 16). As shown in FIG. 16, on periods of the first to sixth gate clock signals GCK1 to GCK6 are all approximately three horizontal scanning periods (3H). Phases of the first gate clock signal GCK1 and the fourth gate clock signal GCK4 are deviated from each other by 180 degrees. Phases of the second gate clock signal GCK2 and the fifth gate clock signal GCK5 are deviated from each other by 180 degrees. Phases of the third gate clock signal GCK3 and the sixth gate clock signal GCK6 are deviated from each other by 180 degrees. The phase of the first gate clock signal GCK1 is advanced from the phase of the second gate clock signal GCK2 by 60 degrees. The phase of the second gate clock signal GCK2 is advanced from the phase of the third gate clock signal GCK3 by 60 degrees. A phase difference of the 60 degrees corresponds to approximately one horizontal scanning period (1H).

FIG. 17 is a diagram showing an example of a relationship between the first to sixth gate clock signals GCK1 to GCK6 and the first to fourth clocks CKA to CKD in each shift register. The following, for example, can be understood from FIG. 17. In odd-order stages of the first shift register 421, the first gate clock signal GCK1 is provided as the first clock CKA, the fourth gate clock signal GCK4 is provided as the second clock CKB, the fifth gate clock signal GCK5 is provided as the third clock CKC, and the second gate clock signal GCK2 is provided as the fourth clock CKD.

<3.2 Operation of Bistable Circuit>

Figure 18:
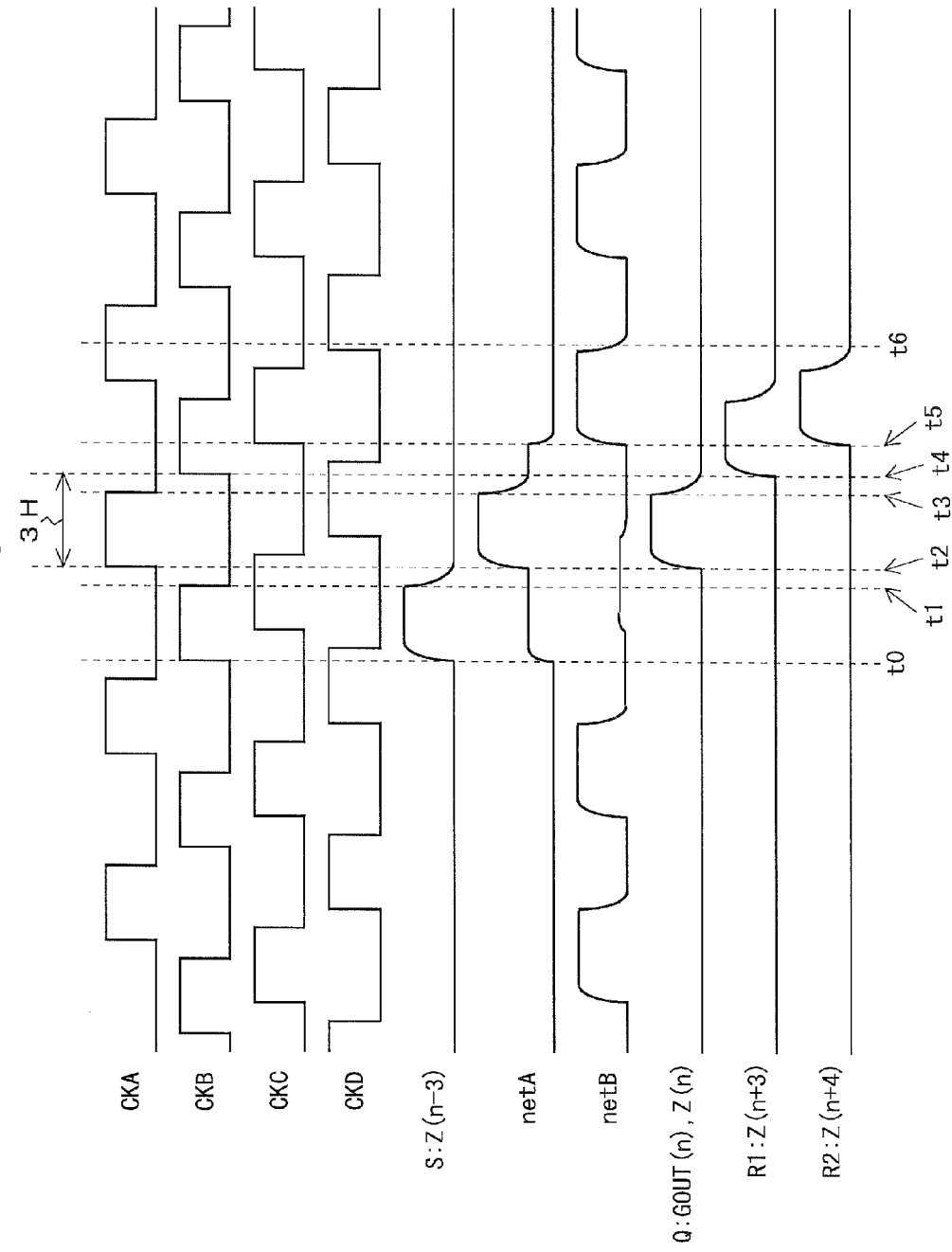
FIG. 18 is a signal waveform diagram for describing an operation of a bistable circuit in the second embodiment.
Figure 19:
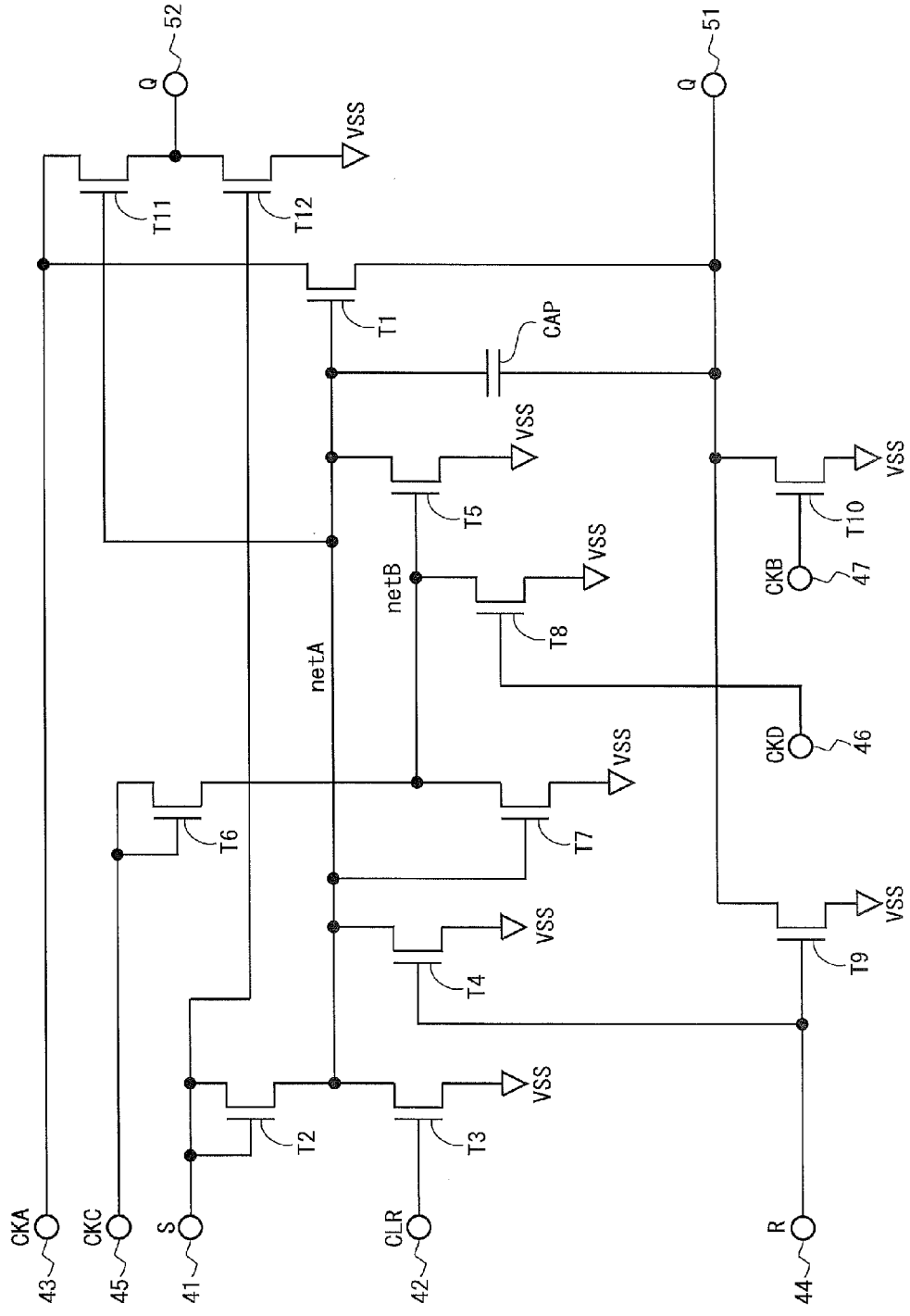
FIG. 19 is a circuit diagram showing a configuration example of a bistable circuit that is included in a shift register in a gate driver.

FIG. 18 is a signal waveform diagram for describing an operation of a bistable circuit in the present embodiment. In the present embodiment, signals that are provided to the bistable circuit as the set signal S, the first reset signal R1, and the second reset signal R2 are different from those of the first embodiment. Specifically, in an n-th stage SR(n) of the entire shift register, another-stage control signal Z(n−3) that is outputted from an (n−3)-th stage SR(n−3) is provided as the set signal S, an other-stage control signal Z(n+3) that is outputted from an (n+3)-th stage SR(n+3) is provided as the first reset signal R1, and an other-stage control signal Z (n+4) that is outputted from an (n+4)-th stage SR(n+4) is provided as the second reset signal R2.

As can be understood from FIGS. 11 and 18, the bistable circuit in the present embodiment performs an operation similar to that of the first embodiment. That is, when reaching the time point t3, potentials of the state signals Q (potentials of the output terminals 51, 52) and a potential of the netA gradually decrease, by the first clock CKA changing from a high level to a low level. Thereafter, when reaching the time point t4, by the first reset signal R1 and the second clock CKB changing from a low level to a high level, the thin-film transistors T9, T10 become in an on state and a potential of the output terminal 51 further decreases. At this time, because the second reset signal R2 is maintained at a low level, the thin-film transistor T4 is in an off state. Therefore, after the time point t4, a potential of the netA is maintained at a high level, and the thin-film transistor T1 is maintained in an on state.

<3.3 Effect>

According to the present embodiment, in a similar manner to that of the first embodiment, in each bistable circuit, a period in which a potential of the netA is maintained at a high level becomes long, and an effect of a decrease in a potential of the state signal Q based on a change of the first clock CKA from a high level to a low level can be sufficiently obtained. Accordingly, after a charge period in each row ends, the scanning signal GOUT falls quickly. As a result, occurrence of a display failure attributable to a color mixture between a color to be displayed in a certain row and a color to be displayed in a next row, and occurrence of a display failure attributable to a waveform distortion of the scanning signal GOUT associated with an increase in a size of a panel can be prevented.

4. Others

<4.1 Generalization of Configuration>

In the first embodiment, the gate driver 400 includes two shift registers (the first shift register 411, and the second shift register 412), and in each bistable circuit of the entire shift register 410, a potential of the netA decreases to a low level based on the state signal Q that is outputted from a bistable circuit which is a third stage after. In the second embodiment, the gate driver 400 includes three shift registers (the first shift register 421, the second shift register 422, and the third shift register 423), and in each bistable circuit of the entire shift register 420, a potential of the netA decreases to a low level based on the state signal Q that is outputted from a bistable circuit which is a fourth stage after. However, the present invention is not limited to this, and can be generalized as follows.

In the gate driver 400 that includes m shift registers and that sequentially drives gate bus lines every one horizontal scanning period, based on an assumption that the following equation (1) is satisfied and that on periods of the state signal Q that is outputted from each bistable circuit are m horizontal scanning periods (mH), the configuration may be such that in each bistable circuit of the entire shift register, a potential of the netA decreases to a low level based on the state signal Q that is outputted from a bistable circuit which is a k-th stage after.

$$m+1 \leq k \leq 2m-1 \quad (1)$$

When the gate driver 400 is configured by the two shift registers like in the first embodiment, for example, "$3 \leq k \leq 3$" is obtained from Equation (1). Therefore, in each bistable circuit of the entire shift register, the configuration may be such that a potential of the netA is decreased to a low level based on the state signal Q that is outputted from a bistable circuit which is a third stage after the bistable circuit. Further, when the gate driver 400 is configured by the three shift registers like in the second embodiment, for example, "$4 \leq k \leq 5$" is obtained from Equation (1). Therefore, in each bistable circuit of the entire shift register, the configuration may be such that a potential of the netA is decreased to a low level based on the state signal Q that is outputted from a bistable circuit which is a fourth stage or fifth stage after the bistable circuit. Further, when the gate driver 400 is configured by four shift registers, for example, "$5 \leq k \leq 7$" is obtained from Equation (1). Therefore, in each bistable circuit of the entire shift register, the configuration may be such that a potential of the netA is decreased to a low level based on the state signal Q that is outputted from a bistable circuit which is a fifth- to seventh-stages after the bistable circuit.

<4.2 Application to Display Device Other than Liquid Crystal Display Device>

Although a liquid crystal display device is described as an example in the above embodiments, the present invention is not limited to this. The present invention can be also applied to other display devices such as an organic EL (Electro Luminescence).

DESCRIPTION OF REFERENCE CHARACTERS

41 to 48 . . . Input terminal (of bistable circuit)
51, 52 . . . Output terminal (of bistable circuit)
200 . . . Display control circuit
300 . . . Source driver (video signal line drive circuit)
400 . . . Gate driver (scanning signal line drive circuit)
410, 420 . . . Entire shift register
411, 421 . . . First shift register
412, 422 . . . Second shift register
423 . . . Third shift register
600 . . . Display unit
SR, SR1, SR2 . . . Bistable circuit
CAP . . . Capacitor (capacitance element)
T1 to T12 . . . Thin-film transistor
GL1 to GLi . . . Gate bus line
SL1 to SLj . . . Source bus line
GCK1 to GCK6 . . . First to sixth gate clock signals
CKA, CKB, CKC, CKD . . . First clock, second clock, third clock, fourth clock
S . . . Set signal
R1 . . . First reset signal
R2 . . . Second reset signal
Q . . . State signal
GOUT . . . Scanning signal
Z . . . Other-stage control signal
VSS . . . Low-level power source voltage

The invention claimed is:

1. A scanning signal line drive circuit of a display device, that drives a plurality of scanning signal lines which are arrayed in a display unit, the circuit comprising:
    m shift registers, each of the m shift registers including a plurality of bistable circuits having a first state and a second state and connected in series with each other, and each of the m shift registers operating based on a plurality of clock signals that cyclically repeat a first level change of changing from a second level to a first level and a second level change of changing from the first level to the second level, and in each of the m shift registers, the plurality of bistable circuits sequentially become in the first state by one of the plurality of clock signals being provided to each bistable circuit as a scanning signal line drive clock signal, wherein
    the plurality of clock signals provided to the m shift registers as the scanning signal line drive clock signals, each of the scanning signal line drive clock signals having a specific phase at which a change between the first level change and the second level change occurs, the specific phase being different for the scanning signal line drive clock signals of different ones of the m shift registers,
    each bistable circuit includes:
        an output node that is connected to the scanning signal line and that outputs a state signal which indicates either one of the first state and the second state,
        an output control switching element having a second electrode to which the scanning signal line drive clock signal is provided, and a third electrode connected to the output node,
        a first node turn-on unit that changes a level of a first node that is connected to a first electrode of the output control switching element to an on level based on the state signal which is outputted from a bistable circuit of a previous stage of a bistable circuit concerned, and
        a first node turn-off unit that receives the state signal which is outputted from a bistable circuit of a subsequent stage of the bistable circuit concerned, as a first node turn-off signal, and that changes a level of the first node to an off level based on the first node turn-off signal,
    in each bistable circuit, after the bistable circuit concerned becomes in the first state, and after the scanning signal line drive clock signal performs the second level change, a level of the first node turn-off signal changes such that turn-off of the first node is performed, during a period from a time point after a bistable circuit of a next stage of the bistable circuit concerned in a shift register of the m shift registers that includes the bistable circuit concerned becomes in the first state till a time point when the scanning signal line drive clock signal performs the first level change,
    the m shift registers sequentially output the state signal in the first state for each one of the plurality of scanning signal lines,
    the first node turn-off signal for each respective bistable circuit in an entire shift register array including the m shift registers is the state signal that is outputted from a bistable circuit of a k-th stage after the bistable circuit concerned, and
    a relationship between m and k satisfies the following equation:

$$m+1 \leq k \leq 2m-1,$$

where m is an integer equal to or larger than two.

2. The scanning signal line drive circuit according to claim 1, wherein
    each bistable circuit further includes an output node turn-off unit that receives the state signal which is outputted from a bistable circuit of a subsequent stage of the bistable circuit concerned, as an output node turn-off signal, and that turns off the output node based on the output node turn-off signal, and
    in each bistable circuit, after the bistable circuit concerned becomes in the first state, a level of the first node turn-off signal changes such that turn-off of the first node is performed, during a period from a time point after a time point when a level of the output node turn-off signal changes such that turn-off of the output node is performed till a time point when the scanning signal line drive clock signal performs the first level change.

3. The scanning signal line drive circuit according to claim 1, wherein
each bistable circuit further includes
a first node control switching element having a second electrode connected to the first node and a third electrode to which a potential of an off level is applied, and
a second node control unit that controls a potential of a second node which is connected to a first electrode of the first node control switching element based on a clock signal other than the scanning signal line drive clock signal out of the plurality of clock signals and a potential of the first node.

4. The scanning signal line drive circuit according to claim 1, wherein
the scanning signal line drive circuit comprises two shift registers, as the m shift registers, each identical with the shift register,
the two shift registers alternately output the state signal in the first state for each one of the plurality of scanning signal lines, and
the first node turn-off signal for each respective bistable circuit in the entire shift register array including the m shift registers is the state signal that is outputted from a bistable circuit of a third stage after the bistable circuit concerned.

5. The scanning signal line drive circuit according to claim 4, wherein
timings when output of the state signal in the first state is performed from the two shift registers are deviated by a period approximately equal to one horizontal scanning period, and
a period from when the scanning signal line drive clock signal performs the first level change till when the signal performs the second level change and a period from when the signal performs the second level change till when the signal performs the first level change are periods that are approximately equal to two horizontal scanning periods.

6. The scanning signal line drive circuit according to claim 4, wherein
the two shift registers operate based on a first clock signal that is provided to a first-stage bistable circuit of one of the shift registers as the scanning signal drive clock signal, a second clock signal having a phase deviated from that of the first clock signal by 180 degrees, a third clock signal having a phase delayed from that of the first clock signal by 90 degrees, and a fourth clock signal having a phase deviated from that of the third clock signal by 180 degrees.

7. The scanning signal line drive circuit according to claim 1, wherein
timings when output of the state signal in the first state is performed from the m shift registers are deviated by a period approximately equal to one horizontal scanning period, and
a period from when the scanning signal line drive clock signal performs the first level change till when the signal performs the second level change and a period from when the signal performs the second level change till when the signal performs the first level change are periods that are approximately equal to m horizontal scanning periods.

8. The scanning signal line drive circuit according to claim 1, wherein
a wiring for a signal to be provided to each bistable circuit as the first node turn-off signal is formed to branch from a wiring for a signal to be provided to a bistable circuit of a (k−m)-th stage after the bistable circuit concerned as the output node turn-off signal.

9. The scanning signal line drive circuit according to claim 1, wherein
a wiring for transmitting a plurality of drive signals for operating the m shift registers are provided in common to the m shift registers, the plurality of drive signals including the plurality of clock signals.

10. The scanning signal line drive circuit according to claim 1, wherein
switching elements that are included in each bistable circuit are thin-film transistors that are all an n-channel type.

11. The scanning signal line drive circuit according to claim 1, wherein
switching elements that are included in each bistable circuit are thin-film transistors that are made of amorphous silicon.

12. The scanning signal line drive circuit according to claim 1, wherein
switching elements that are included in each bistable circuit are thin-film transistors that are made of microcrystalline silicon.

13. The scanning signal line drive circuit according to claim 1, wherein
switching elements that are included in each bistable circuit are thin-film transistors that are made of polycrystalline silicon.

14. The scanning signal line drive circuit according to claim 1, wherein
switching elements that are included in each bistable circuit are thin-film transistors that are made of oxide semiconductors.

15. A display device that includes the display unit, and comprises the scanning signal line drive circuit according to claim 1.

16. A driving method for driving a plurality of scanning signal lines arrayed in a display unit, by a scanning signal line drive circuit including m shift registers, each of the m shift registers including a plurality of bistable circuits having a first state and a second state and connected in series with each other, and each of the m shift registers operating based on a plurality of clock signals that cyclically repeat a first level change of changing from a second level to a first level and a second level change of changing from the first level to the second level, and in each of the m shift registers, the plurality of bistable circuits sequentially become in the first state by one of the plurality of clock signals being provided to each bistable circuit as a scanning signal line drive clock signal, the method comprising:
a first drive step for changing each bistable circuit from the second state to the first state; and
a second drive step for changing each bistable circuit from the first state to the second state, wherein
the plurality of clock signals provided to the m shift registers as the scanning signal line drive clock signals, each of the scanning signal line drive clock signals having a specific phase at which a change between the first level change and the second level change occurs, the specific phase being different for the scanning signal line drive clock signals of different ones of the m shift registers,
each bistable circuit includes:
an output node that is connected to the scanning signal line and that outputs a state signal which indicates either one of the first state as an on level and the second state as an off level, an output control switching element having a second electrode to which the scanning signal line drive clock signal is provided and a third electrode connected to the output node, and a first node connected to a first electrode of the output control switching element, and in each bistable circuit, the first drive step includes a first node turn-on step of changing a level of the first node to an on level based on the state signal which is outputted from a bistable circuit of a previous stage of the bistable circuit concerned, and a state signal turn-on step of changing a level of the state signal to an on level based on the first level change of the scanning signal line drive clock signal, the second drive step includes a state signal turn-off step of changing a level of the state signal to an off level based on the second level change of the scanning signal line drive clock signal, and a first node turn-off step of receiving the state signal which is outputted from a bistable circuit of a subsequent stage of the bistable circuit concerned, as a first node turn-off signal, and changing a level of the first node to an off level based on the first node turn-off signal, after the state signal turn-on step ends, and after the state signal turn-off step is started, the first node turn-off step is started, during a period from a time point after a bistable circuit of a next stage of the bistable circuit concerned in a shift register of the m shift registers that includes the bistable circuit concerned completes the state signal turn-on step till a time point when the scanning signal line drive clock signal performs the first level change, the m shift registers sequentially output the state signal in the first state for each one of the plurality of scanning signal lines, the first node turn-off signal for each respective bistable circuit in an entire shift register array including the m shift registers is the state signal that is outputted from a bistable circuit of a k-th stage after the bistable circuit concerned, and a relationship between m and k satisfies the following equation:

$$m+1 \leq k \leq 2m-1,$$

where m is an integer equal to or larger than two.

17. The driving method according to claim 16, wherein the scanning signal line drive circuit comprises two shift registers, as the m shift registers, each identical with the shift register, the two shift registers alternately output the state signal in the first state for each one of the plurality of scanning signal lines, and the first node turn-off signal for each respective bistable circuit in the entire shift register array including the m shift registers is the state signal that is outputted from a bistable circuit of a third stage after the bistable circuit concerned.

18. The driving method according to claim 17, wherein timings when output of the state signal in the first state is performed from the two shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to two horizontal scanning periods.

19. The driving method according to claim 16, wherein timings when output of the state signal in the first state is performed from the m shift registers are deviated by a period approximately equal to one horizontal scanning period, and a period from when the scanning signal line drive clock signal performs the first level change till when the signal performs the second level change and a period from when the signal performs the second level change till when the signal performs the first level change are periods that are approximately equal to m horizontal scanning periods.

20. The scanning signal line drive circuit according to claim 1, wherein switching elements that are included in each bistable circuit are thin-film transistors that are made of an In—Ga—Zn based Oxide (IGZO).

* * * * *